(12) United States Patent
Ohbayashi

(10) Patent No.: US 6,320,802 B1
(45) Date of Patent: Nov. 20, 2001

(54) PROGRAM CIRCUIT SUPPRESSING STAND-BY CURRENT AND PERMITTING HIGHLY RELIABLE OPERATION, AND SEMICONDUCTOR MEMORY DEVICE USING THE PROGRAM CIRCUIT

(75) Inventor: Shigeki Ohbayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/785,467

(22) Filed: Feb. 20, 2001

(30) Foreign Application Priority Data

Aug. 31, 2000 (JP) .................................. 12-262467

(51) Int. Cl.[7] .................................... G11C 7/00
(52) U.S. Cl. ........................ 365/200; 365/225.7
(58) Field of Search ................ 365/200, 225.7, 365/226, 189.05, 189.09

(56) References Cited

U.S. PATENT DOCUMENTS

| | | | |
|---|---|---|---|
| 5,612,917 | 3/1997 | Kozaru et al. | 365/200 |
| 5,703,510 | 12/1997 | Iketani et al. | 327/143 |
| 5,825,698 * | 10/1998 | Kim et al. | 365/200 |
| 5,852,580 * | 12/1998 | Ha | 365/200 |
| 5,978,297 * | 11/1999 | Ingalls | 365/225.7 |
| 6,021,067 * | 2/2000 | Ha | 365/185.21 |
| 6,052,313 * | 4/2000 | Atsumi et al. | 365/189.05 |
| 6,108,246 * | 8/2000 | Umezawa et al. | 365/189.09 |
| 6,157,583 * | 12/2000 | Starnes et al. | 365/200 |

FOREIGN PATENT DOCUMENTS 10-340956 12/1998 (JP) .
11-17010 1/1999 (JP) .

* cited by examiner

Primary Examiner—Richard Elms
Assistant Examiner—Anh Phung
(74) Attorney, Agent, or Firm—McDermott, Will & Emery

(57) ABSTRACT

An inverter receives a reset signal output from a reset signal generating circuit, and drives a potential level of a first internal node according to whether a fuse element is blown or not. A transfer gate is provided between the first internal node and a second internal node and drives the first internal node and the second internal node to either a conductive state or a shutdown state according to a delayed reset signal from the reset signal generating circuit. A latch circuit is provided between the second internal node and an output node, and latches a potential level of the second internal node and outputs an inverted level of the potential level of the second internal node to the output node.

12 Claims, 19 Drawing Sheets

PROGRAM CIRCUIT SUPPRESSING STAND-BY CURRENT AND PERMITTING HIGHLY RELIABLE OPERATION, AND SEMICONDUCTOR MEMORY DEVICE USING THE PROGRAM CIRCUIT

BACKGROUND OF THE INVENTION

1. Field of the Invention

The present invention relates to a program circuit capable of recording data in a non-volatile manner and a configuration of a semiconductor memory device using the same program circuit. More particularly, the present invention relates to a program circuit that is applied to a semiconductor memory device including a redundant circuit and a configuration of a semiconductor memory device having such a program circuit.

2. Description of the Background Art

FIG. 17 is a block diagram showing a configuration of a main portion of a conventional semiconductor memory device that includes a redundant circuit.

A memory cell array 1 includes a plurality of word lines WL, a plurality of bit line pairs BL crossing the plurality of word lines WL, and a plurality of memory cells MC provided at the respective crossing points of word lines WL and bit line pairs BL. Memory cell array 1 further includes a redundant word line RWL and a plurality of memory cells MC connected to the redundant word line RWL.

A decoder 2 and a sense amplifier unit 13 are connected to memory cell array 1. Sense amplifier unit 13 includes a plurality of sense amplifiers connected to the plurality of bit line pairs BL, a plurality of transfer gates, and a decoder.

This semiconductor memory device is provided with a replacement circuit 10. Replacement circuit 10 includes a redundancy select circuit 3, a replacement address program circuit 4 and a NAND circuit 5. Replacement circuit 10 and redundant word line RWL constitute a redundancy circuit.

An operation of the semiconductor memory device shown in FIG. 17 will now be described.

Decoder 2 responds to an X address signal XA and selects one of the plurality of word lines WL within memory cell array 1, and raises the potential of the selected word line WL to an H level. Thus, data are read out from memory cells MC connected to the selected word line WL to corresponding bit line pairs BL. The data thus read out are amplified by the sense amplifiers provided in sense amplifier unit 13. The decoder in sense amplifier unit 13 responds to a Y address signal YA and renders one of the plurality of transfer gates conductive. As a result, one piece of data is output.

If there is a defect associated with a certain word line WL, redundant word line RWL is used instead of that word line WL. In this case, the output of redundancy select circuit 3 attains an H level. An address of the word line WL to be replaced is programmed in replacement address program circuit 4.

If an address designated by X address signal XA matches the address (replacement address) programmed in replacement address program circuit 4, then the output of replacement address program circuit 4 attains an H level. When the outputs of redundancy select circuit 3 and replacement address program circuit 4 both attain an H level, the output of NAND circuit 5 (a decoder inactivation signal DA) attains an L level. Thus, the decoder becomes inactive, and all the word lines WL enter an unselected state. The potential of redundant word line RWL rises to an H level.

Thus, in response to a defective word line WL or a word line WL connected to a defective memory cell MC having been selected, redundant word line RWL is selected instead of the word line WL.

Although not shown in FIG. 17, memory cell array 1 may include a redundant bit line pair.

FIG. 18 is a circuit diagram illustrating a configuration of a fuse program circuit 810 included in redundancy select circuit 3.

Referring to FIG. 18, fuse program circuit 810 includes a fuse element F1 provided between a node N1 and a power supply potential Vcc; a MOS capacitor C1 provided between node NI and a ground potential GND; an N channel MOS transistor QN1 provided between node N1 and a ground potential GND; and an inverter INV1 that receives and inverts the potential of node N1 and supplies its output to a gate of transistor QN1.

The potential at an output node N2 of inverter INV1 becomes an output level of fuse program circuit 810, and this output level in turn becomes an output level of redundancy select circuit 3. Thus, the output level of fuse program circuit 810 is at an L level when a fuse is not blown and at an H level when the fuse is blown.

In a normal mode, i.e., when redundant word line RWL is not in use (referred to as a "redundancy non-selected mode"), fuse F1 is connected. Thus, the potential of node N2 is at a ground level, and a signal of an L level is input to NAND circuit 5 in FIG. 17. As a result, decoder inactivation signal DA attains an H level, and the potential of redundant word line RWL remains inactive.

When redundant word line RWL is to be used (referred to as a "redundancy selected mode"), fuse F1 is blown. At power-on, the potential of node N2 starts to rise towards an H level because of capacitive coupling by the MOS capacitor C1. Further, the potential of node N2 reaches a complete H level by a positive feedback circuit consisting of transistor QN1 and inverter INV1.

Accordingly, in the redundancy non-selected mode, the output of redundancy select circuit 3 attains an L level; whereas, in the redundancy selected mode, it attains an H level.

FIG. 19 is a circuit diagram illustrating a detailed configuration of replacement address program circuit 4. An address setting circuit 40 includes a fuse F11, a MOS capacitor C11, an N channel MOS transistor QN11 and an inverter INV11. An address setting circuit 50 includes a fuse F12, a MOS capacitor C12, an N channel MOS transistor QN12 and an inverter INV12. The configuration and operation of each of address setting circuits 40 and 50 are similar to those of fuse program circuit 810 included in redundancy select circuit 3 shown in FIG. 18.

Thus, the potential at node N21 of address setting circuit 40 attains an L level when fuse F11 is connected and an H level when fuse F11 is blown. Similarly, the potential at node N22 of address setting circuit 50 is at an L level when fuse F12 is connected and at an H level when fuse F12 is blown.

Between an input terminal I1 and an output terminal O1 are connected P channel transistors 61, 62 and N channel transistors 71, 72. Similarly, P channel transistors 63, 64 and N channel transistors 73, 74 are connected between an input terminal I2 and output terminal O1; P channel transistors 65, 66 and N channel transistors 75, 76, between an input terminal I3 and output terminal O1; and P channel transistors 67, 68 and N channel transistors 77, 78, between an input terminal I4 and output terminal O1.

The gate electrodes of transistors 61, 73, 65, 77 are connected to node N21 of address setting circuit 40. The gate electrodes of transistors 71, 63, 75, 67 are connected to node N1 of address setting circuit 40. The gate electrodes of transistors 62, 64, 76, 78 are connected to node N22 of address setting circuit 50. And the gate electrodes of transistors 72, 74, 66, 68 are connected to node N12 of address setting circuit 50.

Pre-decode signals, obtained by pre-decoding X address signals XA, are programmed in replacement address program circuit 4 shown in FIG. 19. The way of programming in program circuit 4 will now be described.

First, pre-decode signals X0·X1, X0·/X1, /X0·X1, /X0·/X1 are defined as follows:

If X0=H level and X1=H level, then X0·X1=H level;
If X0=H level and X1=L level, then X0·/X1=H level;
If X0=L level and X1=H level, then /X0·X1=H level; and
If X0=L level and X1=L level, then /X0·/X1=H level.

Under the conditions other than the above, pre-decode signals X0·X1, X0·/X1, /X0·X1 and /X0·/X1 each attain an L level.

Here, assume that pre-decode signal X0·X1 is applied to input terminal I1, pre-decode signal X0·/X1 to input terminal I2, pre-decode signal /X0·X1 to input terminal I3, and pre-decode signal /X0·/X1 to input terminal I4.

When fuses F11, F12 are both connected, only input terminal I1 is connected to output terminal O1, and accordingly, pre-decode signal X0·X1 appears at output terminal O1. Thus, the output at the time when X0=H level and X1=H level becomes an H level, and at this time, redundant word line RWL is selected. This means that an address of X0=X1=H level has been programmed to replacement address program circuit 4 by fuses F11 and F12.

When fuse F11 is blown or disconnected and fuse F12 is connected, pre-decode signal X0·/X1 appears at output terminal O1. Thus, an address of X0=H level and X1=L level is programmed. When fuse F11 is connected and fuse F12 is disconnected, pre-decode signal /X0·X1 appears at output terminal O1. Thus, an address of X0=L level and X1=H level is programmed. When fuses F11 and F12 are both blown, pre-decode signal /X0·/X1 appears at output terminal O1. Thus, an address of X0=X1=L level is programmed.

Replacement address program circuit 4 shown in FIG. 19 is provided with four pre-decode signals X0·X1, X0·/X1, /X0·X1 and /X0·/X1 obtained by pre-decoding two X address signals X0 and X1. Since there are normally four or more X address signals, a plurality of circuits each as shown in FIG. 19 are provided, with their outputs being input into NAND circuit 5 shown in FIG. 17.

With the configuration as described above, information as to whether the redundancy replacement should be conducted and an address where such redundancy replacement is to be conducted are recorded in a non-volatile manner, according to the connected/disconnected patterns of fuse elements.

It should be understood, however, that the configuration of fuse program circuit is not limited to that shown in FIG. 18.

FIG. 20 is a circuit diagram illustrating a configuration of another conventional fuse program circuit 800.

Fuse program circuit 800 includes: a capacitor C1 provided between a node N1 and a power supply potential Vcc; a fuse element F1 provided between node N1 and a ground potential GND; a P channel MOS transistor QP1 provided between node N1 and a power supply potential Vcc; and an inverter INV1 that receives and inverts the potential of node N1 and supplies its output to a gate of the transistor QP1.

Transistor QP1 and inverter INV1 constitute a half latch.

The output of inverter INV1 is applied to a node N2, which becomes an output potential of fuse program circuit 800. The potential level of node N2 is at an H level when the fuse is not blown, and becomes an L level when the fuse is blown.

Thus, fuse program circuit 800 shown in FIG. 20 has fundamentally the same configuration as fuse program circuit 810 shown in FIG. 18, except that polarities of the transistors are complementary to each other and, in response, the circuit configuration has been modified.

Now, disadvantages in the operations of these circuits will be explained, first as to the circuit shown in FIG. 20.

In general, fuse element F1 of FIG. 20 is made of polycrystalline silicon (polysilicon) or metal interconnection.

Fuse element F1 is normally disconnected as follows. Laser light is illuminated onto fuse element F1 to locally raise the temperature of the fuse, thereby causing fuse element F1 itself to evaporate.

A resistance of fuse element F1 before laser illumination is at most 10 KΩ, although it varies dependent on the material being used.

Raising the resistance of fuse element F1 by laser illumination to an open state, i.e., at least 1GΩ, corresponds to blowing of the fuse. Fuse program circuit 800 serves to recognize such a large change in resistance of the fuse.

There are some cases where the fuse material is not completely evaporated by laser illumination, for example, due to displacement of focus of laser light, variation in thickness of an insulating film deposited on the fuse, or subtle misalignment of the location to be illuminated, which causes a small portion of the fuse material to remain. In this case, fuse element F1 does not acquire a completely open state even after the laser illumination, with a high-resistance component being left. Hereinafter, such a remaining portion is called a "blown fuse remainder".

The structure of fuse element and disadvantages at the time of laser illumination are disclosed, for example, in Japanese Patent Laying-Open No. 10-340956 and Japanese Patent Laying-Open No. 11-17010.

At the time of mass production, there are cases where it is difficult to stabilize the high-resistance component due to the blown fuse remainder constantly at a level at least 10 MΩ.

Fuse program circuit 800 shown in FIG. 20 is designed in such a way that the output level becomes an H level when fuse element F1 is not blown and an L level when fuse element F1 is blown.

Hereinafter, the case where there exists a high-resistance component of about 10 MΩ as the remainder of blown fuse element F1 will be considered.

Here, assume that power supply potential Vcc rises very slowly after power-on. In this case, capacitor C1 may not work effectively to set node N1 to an H level, and thus, the level of node N1 may be an L level even if the fuse is blown. In such a case, the output level of fuse program circuit 800 attains an H level, which leads to a malfunction.

Further, when the high-resistance component of about 10 MΩ exists, even if the level of node N1 becomes an H level and the output level of fuse program circuit 800 attains an L level assuring a normal operation, there may arise another problem that a stand-by current above a standard level flows.

More specifically, a leakage path for the current may be created through transistor QP1 connected to node N1, via the high resistance of the blown fuse remainder, towards ground potential GND. If power supply potential Vcc=3V, for example, the current value due to such a leakage path becomes I=V/R=3V/10MΩ=0.3 μA.

In recent years, a requirement for the stand-by current for a static semiconductor memory device (SRAM), for example, has become extremely stringent. A standard value of such a stand-by current is, e.g., on the order of 1 µA. Therefore, if an SRAM includes four blown fuses each having a high-resistance component left as the blown fuse remainder of about 10 MΩ, the SRAM immediately becomes below standards, thereby decreasing the yield.

Similarly, fuse program circuit 810 shown in FIG. 18 is designed such that its output level becomes an L level when the fuse is not blown and an H level when the fuse is blown.

In this case, again, assume that there exists the blown fuse remainder. If power supply potential Vcc rises very slowly after power-on, as in the case of FIG. 20, capacitor C1 will not work effectively to cause node N1 to attain an L level. Accordingly, due to the high-resistance component as the blown fuse remainder, node N1 will attain an H level, the output level of fuse program circuit 810 will become an L level, thereby causing a malfunction.

Even in the case where node N1 becomes an L level after blowing the fuse, and even if the output level of fuse program circuit 810 becomes an H level and a normal operation is conducted, a stand-by current will inevitably flow from power supply potential Vcc via the high resistance of the blown fuse remainder towards transistor QN1. This again decreases the yield.

SUMMARY OF THE INVENTION

An object of the present invention is to provide a program circuit that has a high operating margin against leakage of a conduction setting element, e.g., leakage due to a blown fuse remainder, and that is capable of suppressing a stand-by current Another object of the present invention is to provide a semiconductor memory device that has a high operating margin against leakage of a conduction setting element, e.g., leakage due to a blown fuse remainder, and that is capable of suppressing a stand-by current.

In summary, the present invention is a program circuit that includes a signal generating circuit, a first internal node, a drive circuit, a second internal node, a third switch circuit and a potential retaining circuit.

The signal generating circuit generates a first trigger signal and a second trigger signal that is delayed by a prescribed time from the first trigger signal.

The drive circuit operates by receiving a first power supply potential and a second power supply potential that is different from the first power supply potential, and drives the potential of the first internal node. The drive circuit includes a first switch circuit, a conduction setting element and a second switch circuit. The first switch circuit is provided within a first path extending from the second power supply potential to the first internal node, and attains a conductive or shutdown state according to the first trigger signal. The conduction setting element is provided within the first path in series with the first switch circuit. It can be externally set to either a conductive or non-conductive state in a non-volatile manner. The second switch circuit is provided within a second path extending from the first power supply potential to the first internal node. It attains a conductive or shutdown state according to the first trigger signal, complementarily to the first switch circuit.

The third switch circuit causes the first internal node and the second internal node to attain a conductive or shutdown state according to the second trigger signal. The potential retaining circuit operates by receiving the first and second power supply potentials. It retains the potential level of the second internal node and outputs the same.

The present invention according to another aspect is a semiconductor memory device that includes a memory cell array, a normal memory cell select circuit and a redundant memory cell select circuit.

A plurality of memory cells are arranged in the memory cell array. The memory cell array includes a plurality of normal memory cells, and a plurality of spare memory cells for recovery of the normal memory cells. The normal memory cell select circuit selects a normal memory cell according to an address signal. The redundant memory cell select circuit prestores a defective address having a defective memory cell, and selects a spare memory cell instead of the normal memory cell according to the address signal.

The redundant memory cell select circuit includes a program circuit for storing the defective address in a non-volatile manner.

The program circuit includes a signal generating circuit, a first internal node, a drive circuit, a second internal node, a third switch circuit and a potential retaining circuit.

The signal generating circuit generates a first trigger signal and a second trigger signal that is delayed by a prescribed time from the first trigger signal.

The drive circuit operates by receiving a first power supply potential and a second power supply potential that is different from the first power supply potential, and drives the potential of the first internal node. The drive circuit includes a first switch circuit, a conduction setting element, and a second switch circuit. The first switch circuit is provided within a first path extending from the second power supply potential to the first internal node, and attains a conductive or shutdown state according to the first trigger signal. The conduction setting element is provided within the first path in series with the first switch circuit, and can be externally set to either a conductive or non-conductive state in a non-volatile manner. The second switch circuit is provided within a second path extending from the first power supply potential to the first internal node, and is set to a conductive or shutdown state according to the first trigger signal, complementarily to the first switch circuit.

The third switch circuit causes the first and second internal nodes to attain a conductive or shutdown state according to the second trigger signal. The potential retaining circuit operates by receiving the first and second power supply potentials, and retains the potential level of the second internal node for output.

Accordingly, the present invention has advantages that, despite leakage of the conduction setting element, e.g., leakage due to the remainder of blown fuse element, the third switch circuit shuts down the leakage path, so that it is possible to set a high operating margin against the blown fuse remainder, and to suppress a stand-by current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Program Circuit Resistant to Blown Fuse Remainder

Figure 1:
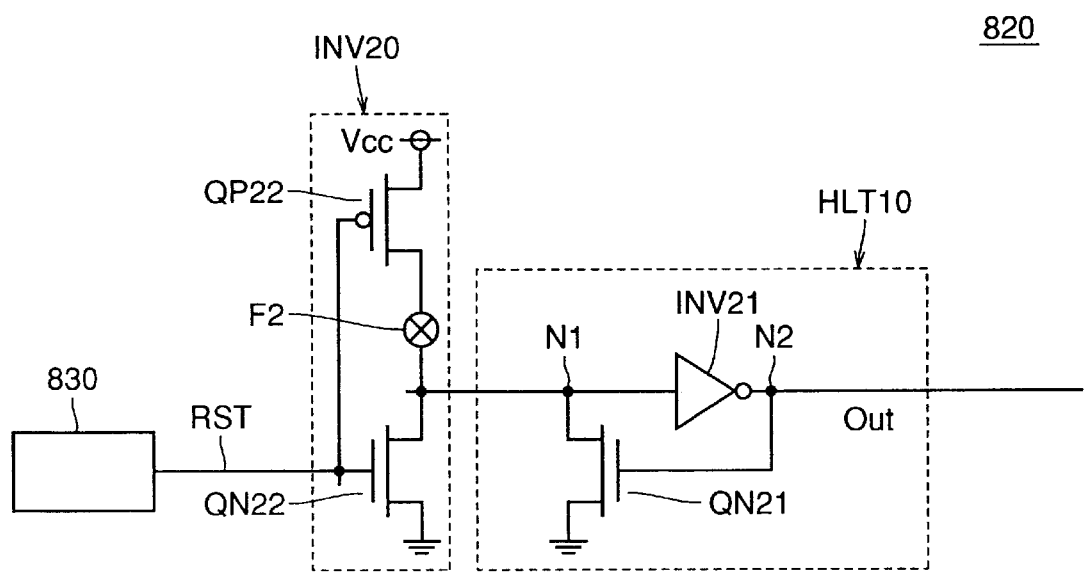
FIG. 1 is a circuit diagram showing an exemplary configuration of a fuse program circuit 820 capable of suppressing a malfunction due to a blown fuse remainder.

FIG. 1 is a circuit diagram showing an exemplary configuration of a fuse program circuit 820 that is capable of suppressing a malfunction due to the blown fuse remainder as described above.

Fuse program circuit 820 includes: an inverter circuit INV20 that receives an output signal from a reset signal generating circuit 830 and has its output level changeable according to whether a fuse element is blown or not; and a half latch circuit HLT10 that receives and retains the output of inverter INV20 and generates an output of fuse program circuit 820.

Inverter INV20 includes a P channel MOS transistor QP22, a fuse element F2 and an N channel MOS transistor QN22 that are connected in series between a power supply potential Vcc and a ground potential GND.

The gates of transistors QP22 and QN22 both receive a reset signal RST from reset signal generating circuit 830.

A connect node between fuse element F2 and transistor QN22 corresponds to the output node N1 of inverter INV20.

Half latch circuit HLT10 includes an N channel MOS transistor QN21 provided between node N1 and a ground potential GND, and an inverter INV21 that receives and inverts the potential level of node N1 and supplies its output to the gate of transistor QN21.

The output of inverter INV21 is supplied to the output node N2 as the output level of fuse program circuit 820.

As will be described below, the reset signal generating circuit 830 shown in FIG. 1 may be configured to generate the reset signal RST based on an externally supplied control signal, or to generate the power on reset signal POR according to a rise of power supply potential Vcc after power-on. The configuration of the power on reset circuit generating such a power on reset signal is disclosed, for example, in U.S. Pat. No. 5,703,510.

The fuse program circuit 820 shown in FIG. 1 uses a signal supplied from this reset signal generating circuit 830, so that it is unlikely to suffer a malfunction due to the blown fuse remainder even in the case where the power supply potential Vcc rises very slowly.

Fuse program circuit 820 is designed such that its output becomes an L level when the fuse is not blown and an H level when the fuse is blown.

Figure 2:
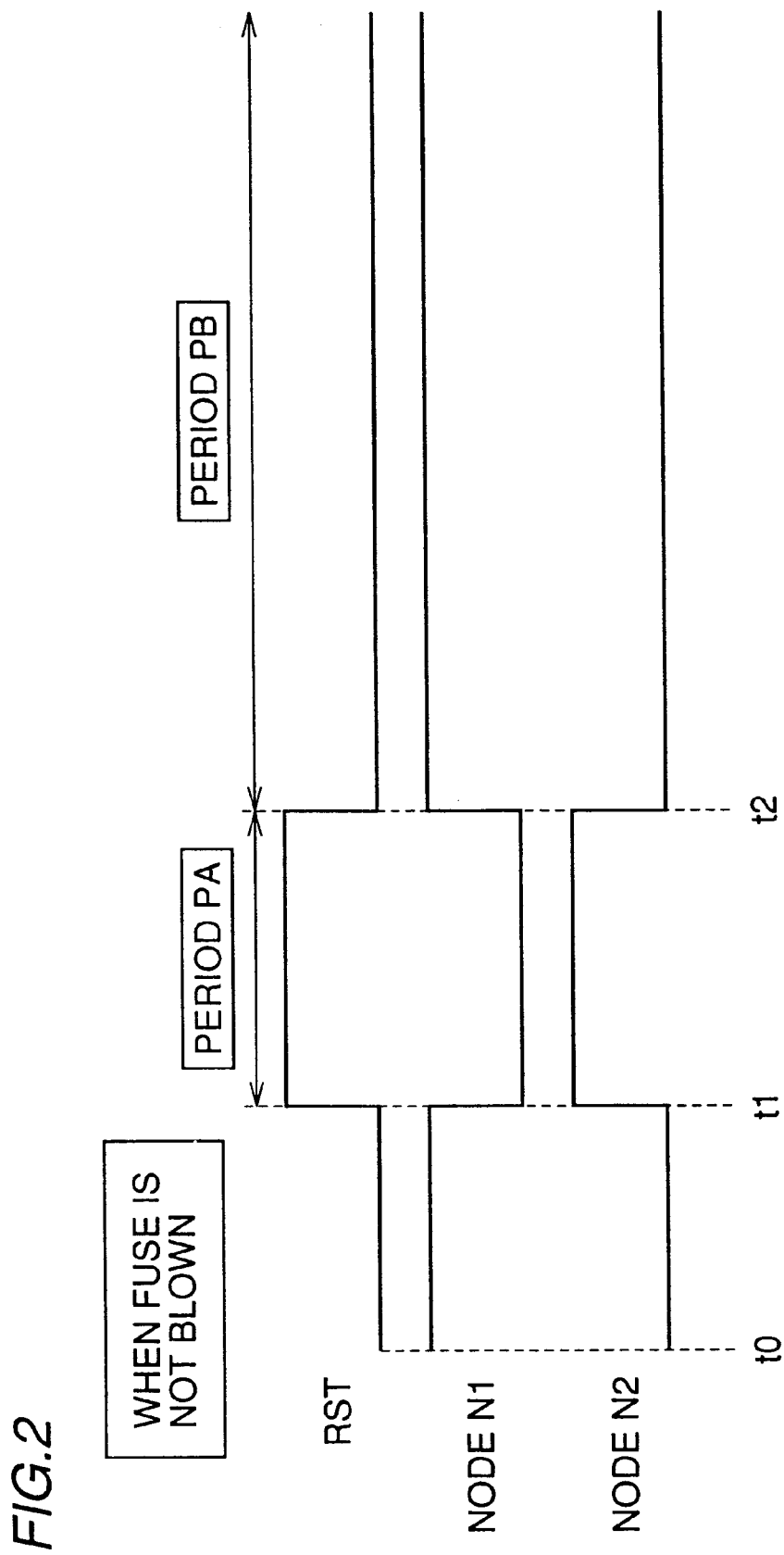
FIG. 2 is a timing chart illustrating an operation of fuse program circuit 820.

FIG. 2 is a timing chart illustrating the operation of fuse program circuit 820 shown in FIG. 1. It is assumed that fuse element F2 is not blown in FIG. 2.

Referring to FIG. 2, after power supply potential Vcc completely rises to a prescribed level at time t0, external reset signal RST attains an H level at time t1. It maintains the H level until time t2. The time period from t1 to t2 during which signal RST is held at the H level is called a period PA.

When reset signal RST attains the H level at time t1, in fuse program circuit 820 with its fuse element F2 having not been blown, transistors QP22 and QN22 operate as an inverter and node N1 attains an L level. Thus, the output level of fuse program circuit 820 becomes an H level.

At time t2, when signal RST attains an L level, node N1 attains an H level, and the output level of fuse program circuit 820 becomes an L level.

Hereinafter, a time period after time t2 wherein signal RST is at an L level is called a period PB.

Figure 3:
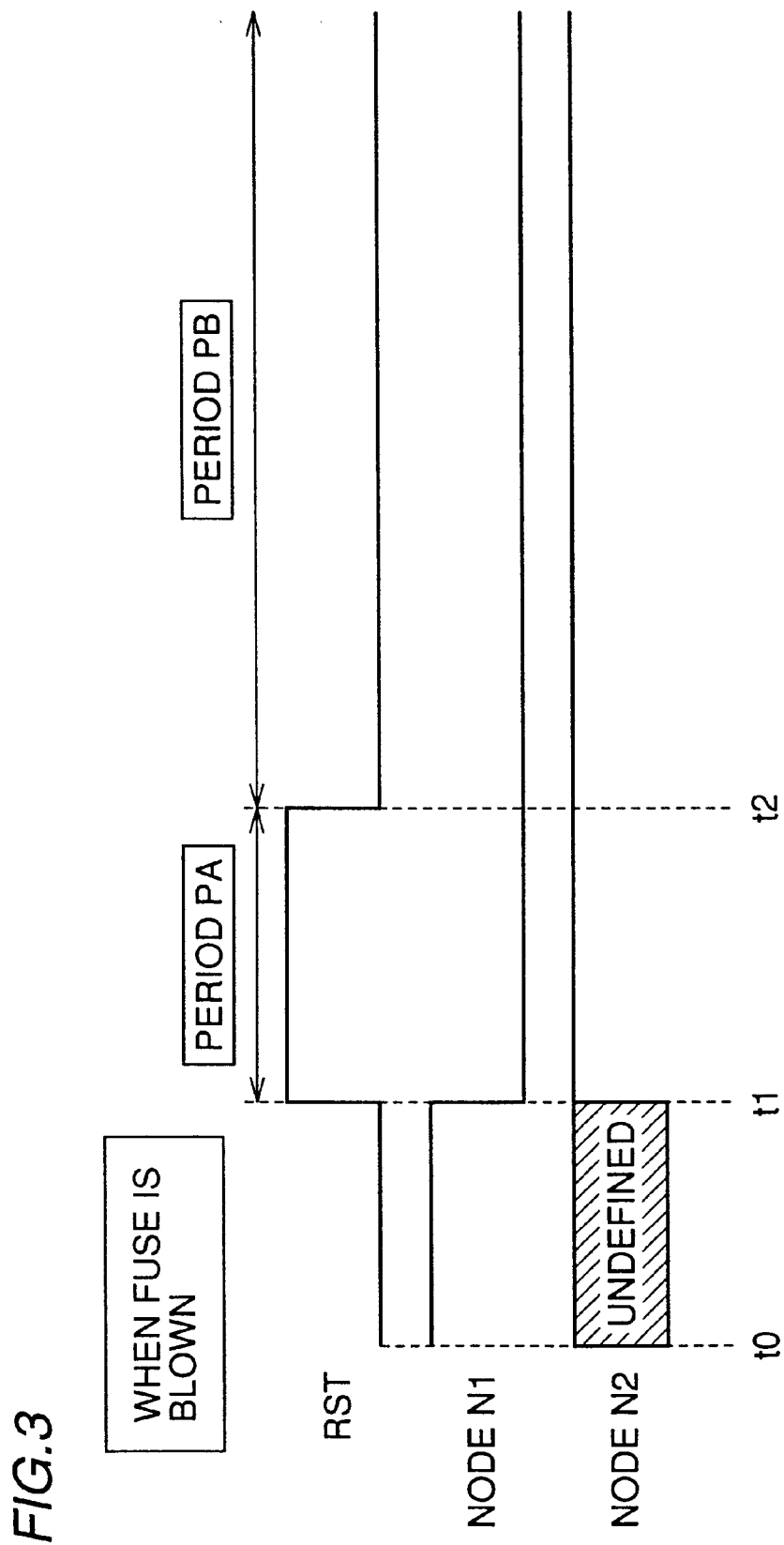
FIG. 3 is a timing chart illustrating the operation of fuse program circuit 820 in the case where the fuse F2 is blown.

FIG. 3 is a timing chart illustrating the operation of fuse program circuit 820 shown in FIG. 1 in the case where fuse F2 is blown.

When reset signal RST attains an H level at time t1, irrespective of the state of fuse element F2, transistor QN22 turns on, so that node N1 attains an L level. In response thereto, the output level of fuse program circuit 820 becomes an H level. Further, transistor QN21 is rendered conductive, and the output level of half latch circuit HLT10 is retained at an H level.

At time t2, reset signal RST attains an L level. Since fuse element F2 has been blown, node N1 is not charged even though transistor QP22 turns on, and thus, node N1 maintains the L level. Accordingly, the output level of fuse program circuit 820 also maintains the H level.

Here, even if there exists a high-resistance component due to the remainder of blown fuse F2, transistor QN21 of half latch circuit HLT10 is at an ON state. Therefore, if the ON resistance of transistor QN21 is sufficiently smaller than the high-resistance component of the blown fuse remainder, the level of node N1 will not exceed the logical threshold value of inverter INV20.

For example, the ON resistance of transistor QN21 normally is not greater than 100KΩ. This is sufficiently lower than the typical value of 10MΩ of the remainder of blown fuse element.

Accordingly, in this case, fuse program circuit 820 is prevented from malfunctioning even in the presence of the blown fuse remainder.

A semiconductor memory device, e.g., SRAM, using fuse program circuit 820 as shown in FIG. 1 comes to operate with its defective memory cell being replaced during period PB, i.e., after a pulse of an H level is input as reset signal RST and while it maintains the L level.

In FIG. 1, a signal that is input into inverter INV20 is not limited to the reset signal RST that is generated based on an external control signal. It may be a power on reset signal POR that is generated by reset signal generating circuit 830 in response to a rise of power supply potential Vcc.

Figure 4:
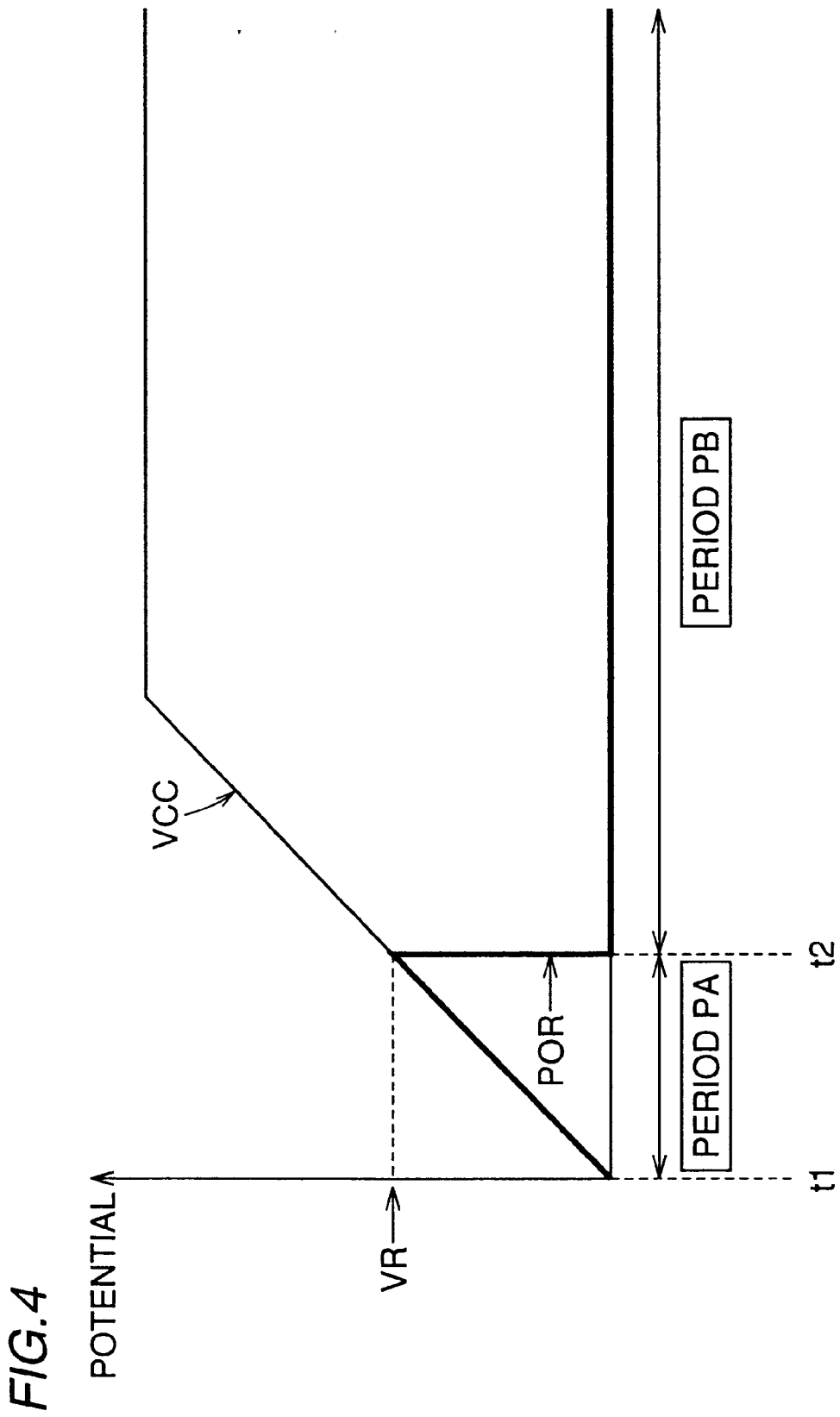
FIG. 4 is a timing chart illustrating an output waveform in the case where a reset signal generating circuit 830 generates a power on reset signal POR.

FIG. 4 is a timing chart illustrating an output waveform in the case where reset signal generating circuit 830 shown in FIG. 1 generates the power on reset signal POR.

Referring to FIG. 4, reset signal generating circuit 830 has a potential level that is identical to the power supply potential Vcc from power-on at time t1 when the power supply potential Vcc starts to rise, until it reaches a prescribed potential VR at time t2.

This time period from time t1 to time t2 is also called a period PA.

When power supply potential Vcc exceeds the prescribed potential VR after time t2, reset signal generating circuit 830 drives power on reset signal POR as its output signal to an L level. The time period after time t2, i.e., after power supply potential Vcc has exceeded the prescribed potential VR, is also called a period PB.

Even if power on reset signal POR changes as shown in FIG. 4 during the periods PA and PB in FIG. 4, fuse program circuit 820 operates in the same manner as in the periods PA and PB shown in FIGS. 2 and 3.

Thus, fuse program circuit 820 shown in FIG. 1 exhibits a very high operating margin against the blown fuse remainder. However, it still poses the problem of the stand-by current.

Specifically, in the case where there exists a high-resistance component of 10MΩ due to the blown fuse remainder and still fuse program circuit 820 normally operates, node N1 is at an L level during the operating period PB. Thus, the stand-by current inevitably flows from transistor QP22 via the blown fuse remainder towards transistor QN21.

Therefore, the semiconductor integrated circuit device, e.g., SRAM, employing such fuse program circuit 820 still suffers the problem that its stand-by current is not restricted within the standard value, which decreases the yield.

Configuration Capable of Suppressing Stand-by Current

Figure 5:
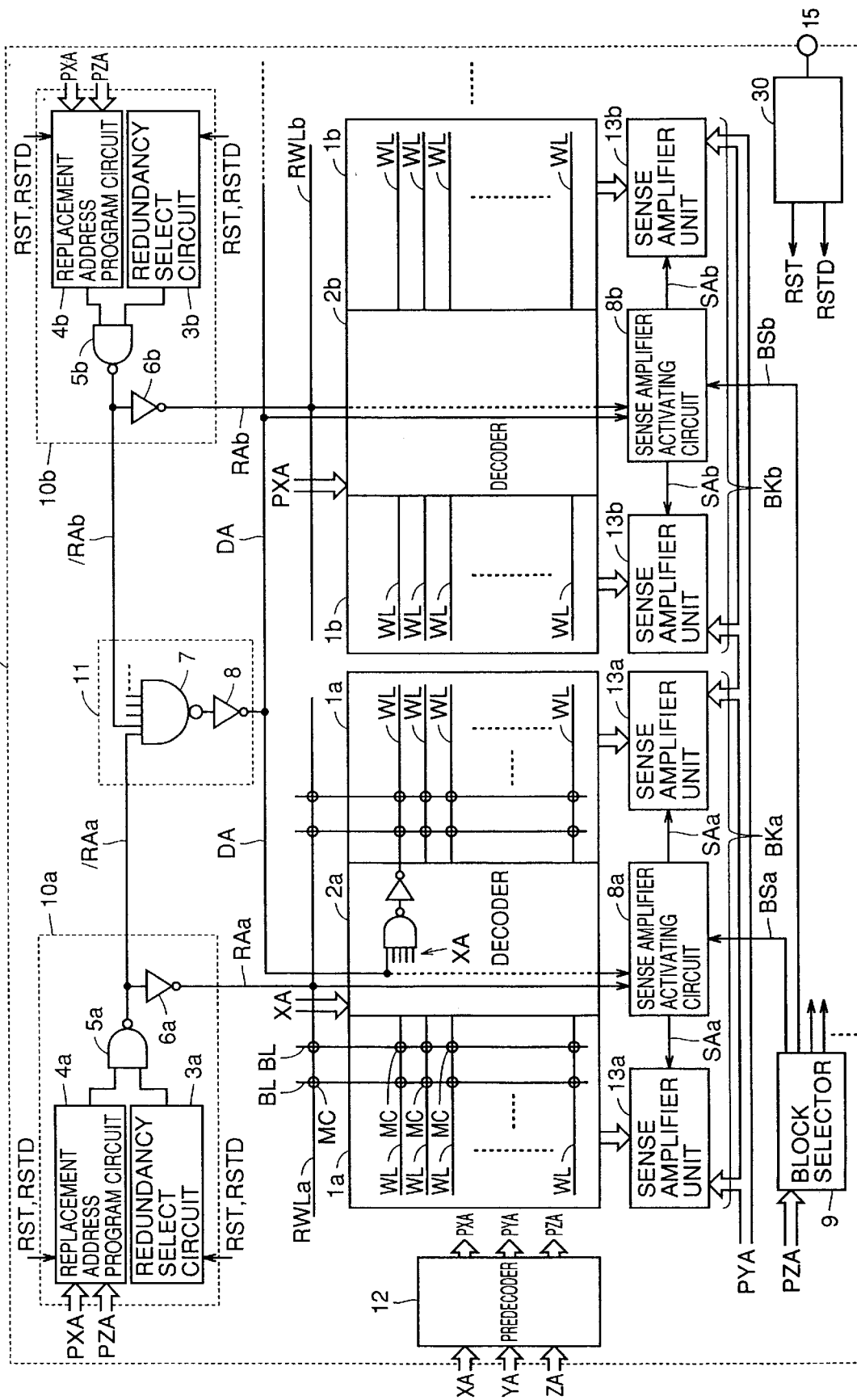
FIG. 5 is a schematic block diagram showing a configuration of a semiconductor memory device 1000 according to a first embodiment of the present invention.

FIG. 5 is a schematic block diagram showing a configuration of a semiconductor memory device 1000 according to the first embodiment of the present invention. Semiconductor memory device 1000 is formed on a chip CH.

Although the configuration and operation of a semiconductor memory device will now be described, taking an SRAM as an example, the present invention is not limited thereto. It may generally be applied to any semiconductor integrated circuit device that has a program circuit allowing pre-recording of data in a non-volatile manner.

Referring to FIG. 5, semiconductor integrated circuit device 1000 includes a plurality of memory blocks, of which only two memory blocks BKa and BKb are shown representatively. Memory block BKa includes a memory cell array block 1a, a decoder 2a, a sense amplifier unit 13a and a sense amplifier activating circuit 8a. Similarly, memory block BKb includes a memory cell array block 1b, a decoder 2b, a sense amplifier unit 13b and a sense amplifier activating circuit 8b.

Each memory cell array block 1a, 1b includes a plurality of word lines WL, a plurality of bit line pairs BL, and a plurality of memory cells MC provided at their respective crossing points. Each sense amplifier unit 13a, 13b includes a plurality of sense amplifiers connected to the plurality of bit line pairs BL, a plurality of transfer gates (not shown), a decoder and a write driver.

A replacement circuit 10a and a redundant word line RWLa are provided corresponding to memory block BKa, and a replacement circuit 10b and a redundant word line RWLb are provided corresponding to memory block BKb. Redundant memory cells MC are connected to respective redundant word lines RWLa, RWLb.

Replacement circuit 10a includes a redundancy select circuit 3a, a replacement address program circuit 4a, a NAND circuit 5a, and an inverter 6a. Similarly, replacement circuit 10b includes a redundancy select circuit 3b, a replacement address program circuit 4b, a NAND circuit 5b, and an inverter 6b.

Figure 18:
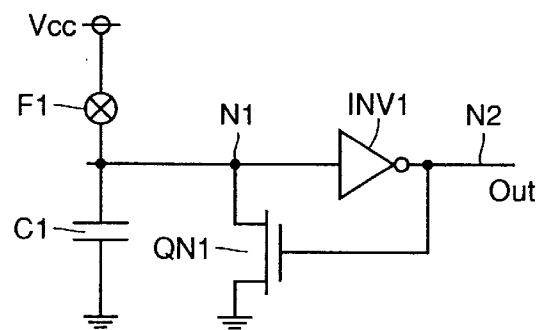
FIG. 18 is a circuit diagram showing a configuration of a fuse program circuit 810 included in a redundancy select circuit 3.

Replacement circuit 10a and redundant word line RWLa constitute a redundancy circuit corresponding to memory block BKa. Replacement circuit 10b and redundant word line RWLb constitute a redundancy circuit corresponding to memory block BKb. The configuration and operation of each redundancy select circuit 3a, 3b are basically identical to the configuration and operation of redundancy select circuit 3 shown in FIG. 18, except for the configuration of the fuse program employed therein as will be described later.

Figure 19:
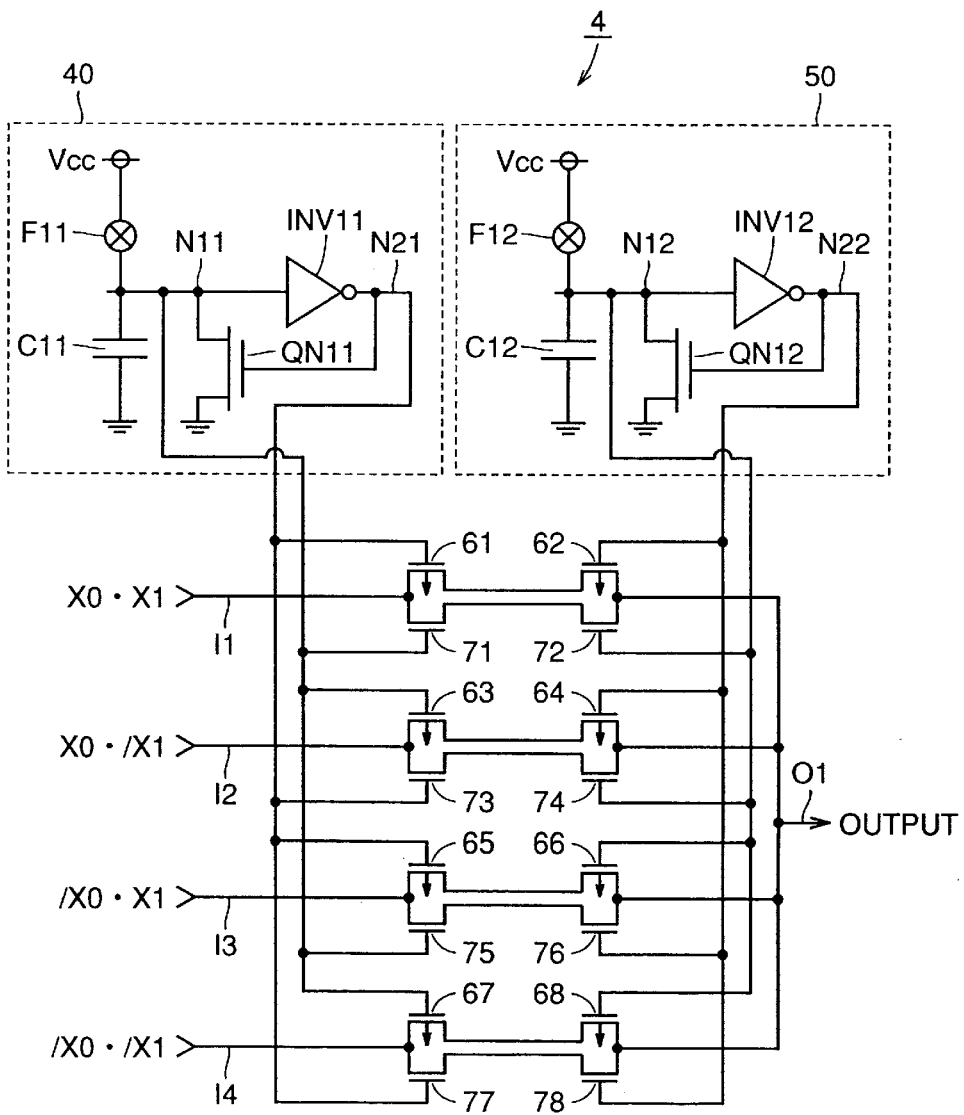
FIG. 19 is a circuit diagram showing a detailed configuration of a replacement address program circuit 4.
Figure 20:
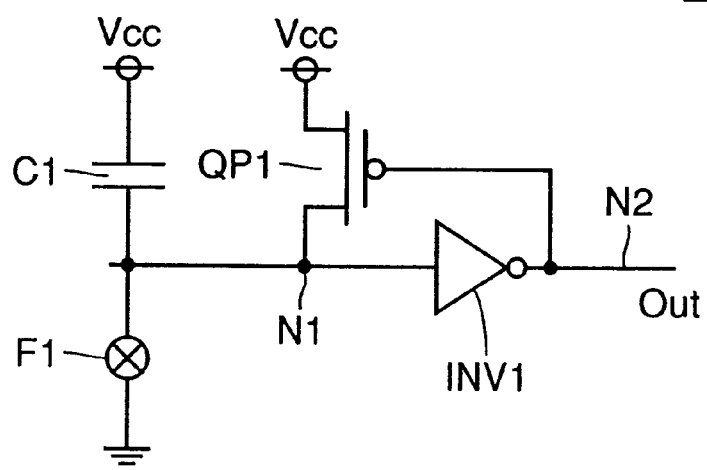
FIG. 20 is a circuit diagram showing a configuration of another conventional fuse program circuit 800.

The configuration and operation of each replacement address program circuit 4a, 4b are basically identical to those of replacement address program circuit 4 shown in FIG. 19, except for the configuration of the fuse program employed therein as will be described later.

A normal memory cell non-select circuit 11 is further provided commonly to all the memory blocks BKa, BKb. Normal memory cell non-select circuit 11 includes a NAND circuit 7 and an inverter 8.

Semiconductor memory device 1000 further includes a pre-decoder 12. Pre-decoder 12 pre-decodes a plurality of X address signals XA and generates a plurality of pre-decode signals PXA. Pre-decoder 12 also pre-decodes a plurality of Y address signals YA and generates a plurality of pre-decode signals PYA. Pre-decoder 12 further pre-decodes a plurality of Z address signals ZA and generates a plurality of pre-decode signals PZA.

The plurality of pre-decode signals PXA are applied to each decoder 2a, 2b and also to each replacement address program circuit 4a, 4b. Pre-decode signals PYA are applied to each sense amplifier unit 13a, 13b. Pre-decode signals (block address signals) PZA are applied to a block selector 9 and also to each replacement address program circuit 4a, 4b.

Semiconductor memory device 1000 further includes a reset signal generating circuit 30 that responds to a control signal externally supplied via a terminal 15 and generates a reset signal RST and a signal RSTD delayed by a prescribed time from reset signal RST.

Replacement address program circuits 4a, 4b and redundancy select circuits 3a, 3b all operate by receiving signals RST and RSTD.

It is understood that reset signal generating circuit 30 may be configured in such a way that it responds to a rise of power supply potential Vcc to generate a power on reset signal POR and a signal PORD delayed by a prescribed time from the signal POR, as will be described later.

Figure 6:
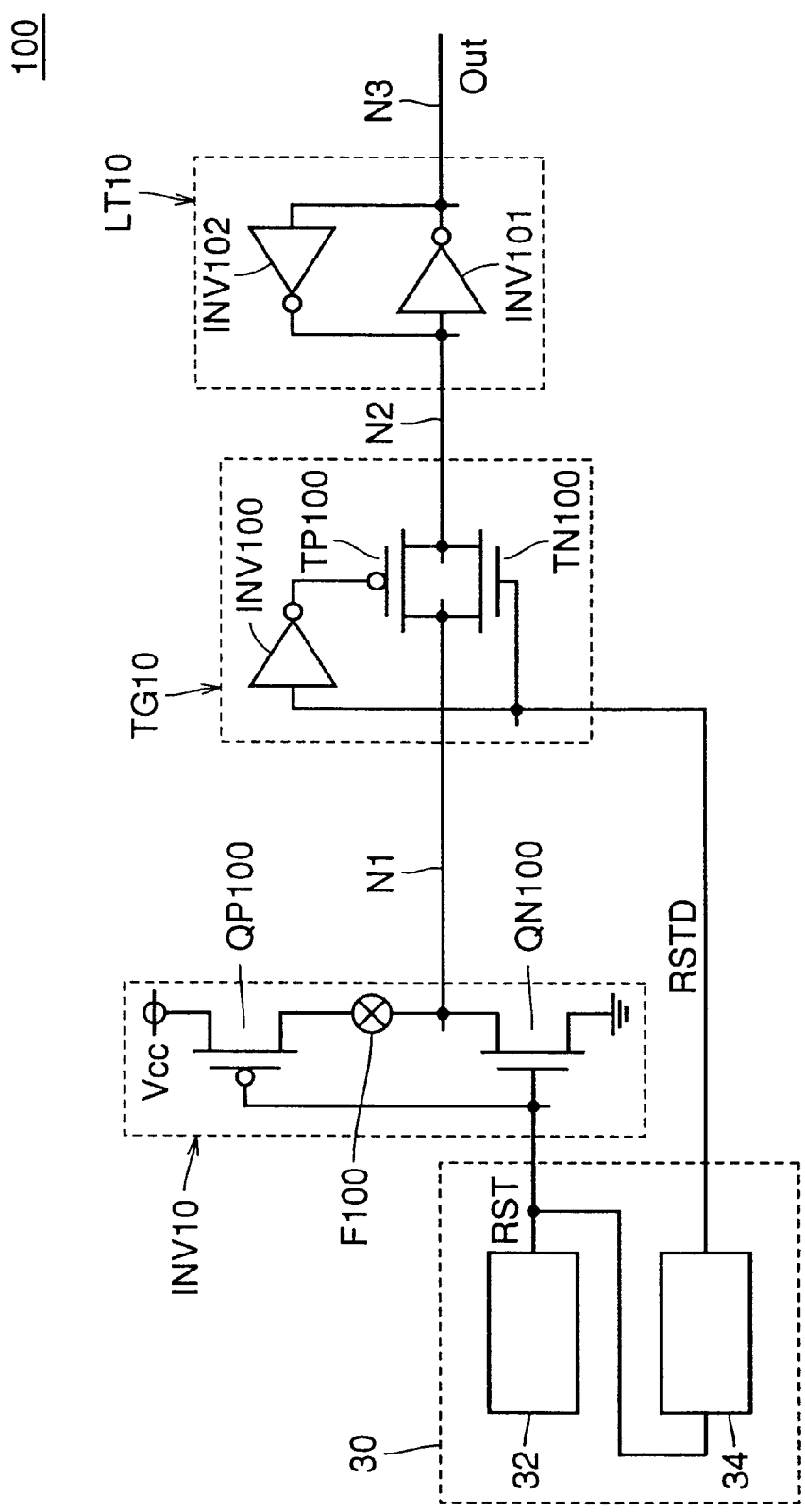
FIG. 6 is a circuit diagram showing a configuration of a fuse program circuit 100.

FIG. 6 is a circuit diagram showing a configuration of fuse program circuit 100 for use in redundancy select circuits 3a and 3b and replacement address program circuits 4a and 4b shown in FIG. 5.

Fuse program circuit 100 includes: an inverter INV10 that receives reset signal RST as an output from reset signal generating circuit 30, and drives the potential level of node Ni according to whether the fuse element is blown or not; a transfer gate TG10 that is provided between node N1 and node N2 and causes nodes N1 and N2 to enter a conductive or shutdown state according to the delayed reset signal RSTD from reset signal generating circuit 30; and a latch circuit LT10 that is provided between node N2 and output node N3 and latches the potential level of node N2 and outputs an inverted level of the potential level of node N2 to node N3.

Reset signal generating circuit 30 includes: a reset circuit 32 that generates a reset signal in response to an external control signal; and a delay circuit 34 that receives an output of reset circuit 32 and delays the signal by a prescribed time to output as a delayed reset signal RSTD.

Inverter INV10 includes a P channel MOS transistor QP100, a fuse element F100 and an N channel MOS transistor QN100 that are connected in series between power supply potential Vcc and ground potential GND.

The gates of transistors QP100 and QN100 receive signal RST from reset signal generating circuit 30. A connect node between fuse element F100 and transistor QN100 is connected to node N1.

It should be understood that reset circuit 32 within reset signal generating circuit 30 may be configured to buffer the externally supplied reset signal RST before output, as described above. Reset signal generating circuit 30 may also be configured to generate power on reset signal POR and signal PORD changing after a prescribed time of delay from signal POR. Further, reset signal generating circuit 30 may be configured such that it provides fuse program circuit 100 with, as the reset signal RST, a signal that corresponds to a logical OR of a signal obtained by buffering externally supplied reset signal RST and a power on reset signal, and also provides fuse program circuit 100 with, as the delayed reset signal RSTD, a signal that is obtained by delaying the reset signal RST corresponding to the logical OR by a prescribed time.

Hereinafter, reset circuit 32 will be described, first assuming that it is configured to buffer externally supplied reset signal RST before output.

Transfer gate TG10 includes: an inverter INV100 that receives and inverts a signal RSTD output from delay circuit 34; an N channel MOS transistor TN100 connected between node N1 and node N2 and having its gate receiving signal RSTD); and a P channel MOS transistor TP100 provided between node N1 and node N2 and having its gate receiving an output of inverter INV100.

Latch circuit LT10 includes: an inverter INV101 that receives a potential level of node N2 as its input and supplies its output signal to a node N3 being an output node of fuse program circuit 100; and an inverter INV102 that receives a potential level of inverter INV101 as its input and supplies its output to an input node of inverter INV101. Inverters INV101 and 102 are CMOS inverters that operate by receiving power supply potential Vcc and ground potential GND.

Fuse program circuit 100 is designed in such a way that its output level becomes an L level when the fuse is not blown and an H level when the fuse is blown.

Figure 7:
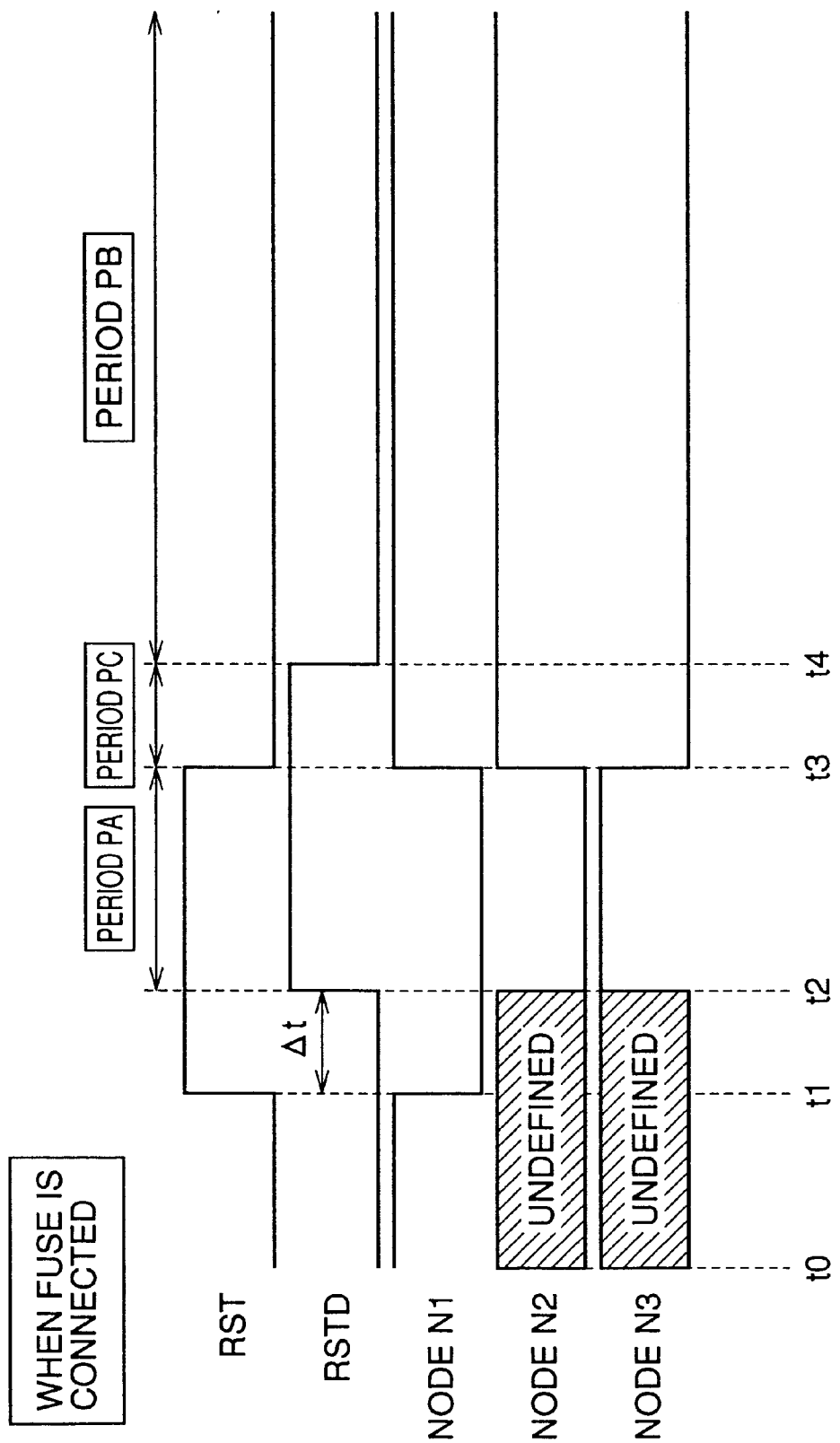
FIG. 7 is a timing chart illustrating an operation of fuse program circuit 100.

FIG. 7 is a timing chart illustrating the operation of fuse program circuit 100 shown in FIG. 6.

As described above, it is assumed that fuse program circuit 100 is provided with reset signal RST and delayed reset signal RSTD from reset signal generating circuit 30. In FIG. 7, the operation of fuse program circuit 100 in the case where fuse element F100 is not blown is illustrated.

Referring to FIG. 7, after power supply potential Vcc completely rises to a prescribed potential level at time t0, reset signal RST output from reset signal generating circuit 30 attains an H level at time t1.

Since transfer gate TG10 is at an OFF state during a time period from t0 to t1 before reset signal RST attains the H level, latch circuit LT10 maintains data at the time of power-up, i.e., undefined data.

When signal RST attains the H level at time t1, as fuse element F100 has not been blown, transistors QP100 and QN100 operate as an inverter and node N1 attains an L level.

Signal RSTD output from delay circuit 34 is a delayed version of signal RST. This signal RSTD attains an H level at time t2, delayed by a time Δt from the transition edge of signal RST from the L level to the H level. Transfer gate TG10 is rendered conductive at this time.

Hereinafter, the time period from t2 to t3 wherein signals RST and RSTD are both at an H level will be called a period PA.

During this period PA, node N1 is at an L level and transfer gate TG10 is conductive. Thus, the potential level of node N1 is transmitted to node N2, and therefore, the potential level of node N2 attains an L level, and the output level of fuse program circuit 100, i.e., the level of node N3, becomes an H level.

Signal RST falls to an L level at time t3, while signal RSTD maintains the H level until time t4. This time period from t3 to t4 will be called a period PC.

During this period PC, node N1 changes from the L level to the H level, and the potential level is transmitted to node N2. Thus, the potential level of node N2 becomes an H level, and the output level of fuse program circuit 100 becomes an L level.

Further, at time t4, signals RST and RSTD both become an L level. The time period after t4 will be called a period PB.

During this period PB, transfer gate TG10 is shut down, and latch circuit LT10 maintains the potential level of node N2 during period PC. Thus, as in period PC, node N2 is at an H level and output node N3 is at an L level.

Figure 8:
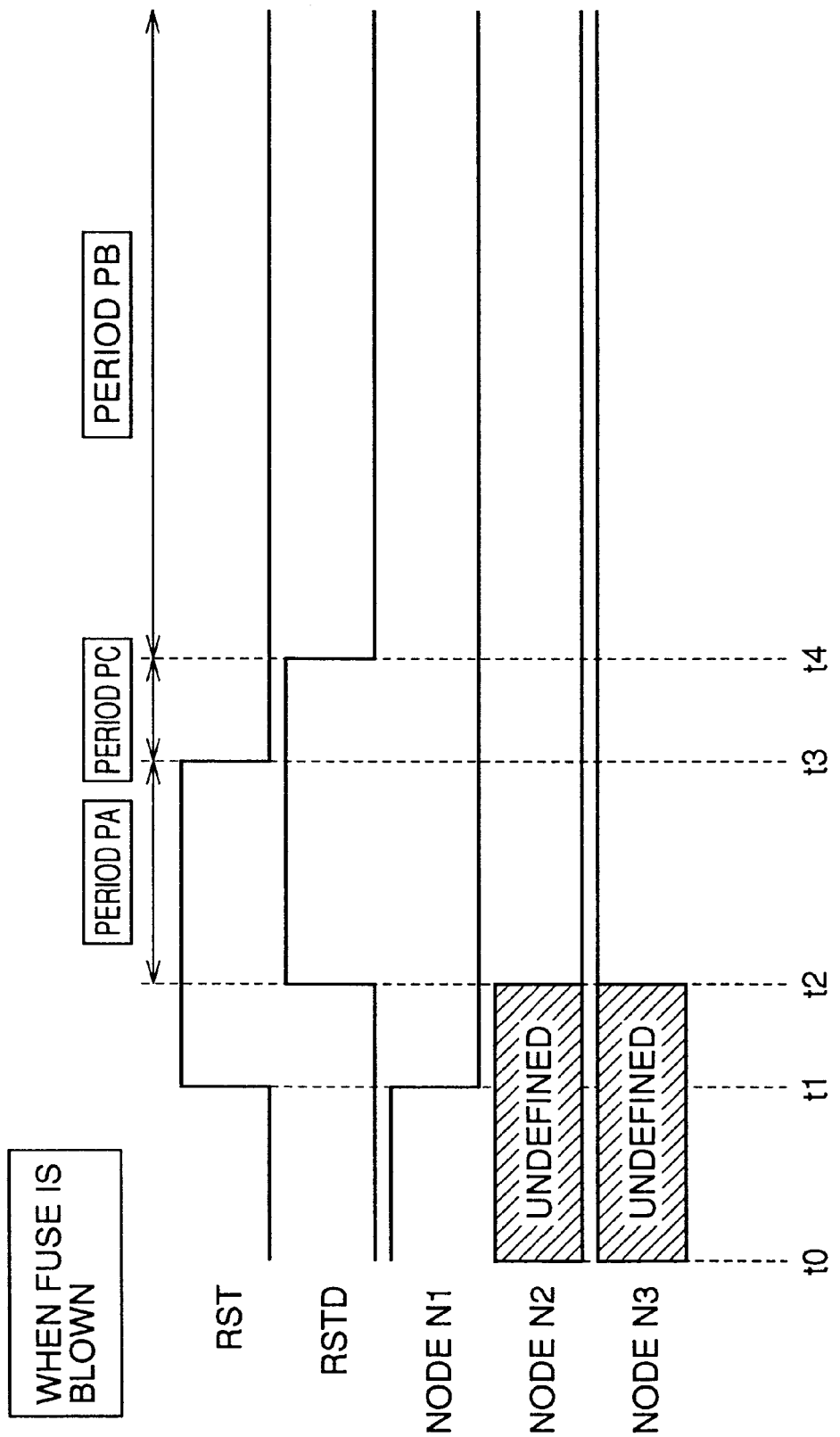
FIG. 8 is a timing chart illustrating the operation of fuse program circuit 100 in the case where a fuse element F100 is blown.

FIG. 8 is a timing chart illustrating the operation of fuse program circuit 100 shown in FIG. 6 in the case where fuse element F100 is blown.

Here, the definitions of periods PA, PB and PC are assumed to be the same as in the case of FIG. 7.

During period PA (from t2 to t3) wherein both signals RST and RSTD are at an H level, transistor QN 100 is rendered conductive and node N1 becomes an L level. Transfer gate TG10 is rendered conductive, and node N2 also becomes an L level. Thus, the level at output node N3 becomes an H level.

Next, during period PC (from t3 to t4) wherein signal RST attains an L level and signal RSTD maintains the H level, node N1 cannot be charged even though transistor QP100 turns on, as fuse F100 has been blown. Therefore, node N1 maintains the L level and, as transfer gate TG10 is conductive, the potential level at node N2 is at an L level. Thus, the level at output node N3 maintains the H level.

During period PB (after t4) wherein both signals RST and RSTD attain an L level, transfer gate TG10 is shut down. Since latch circuit LT10 maintains the potential level at node N2 during period PC, the level at node N2 is at the L level and the level at output node N3 is at the H level, as in period PC.

Figure 9:
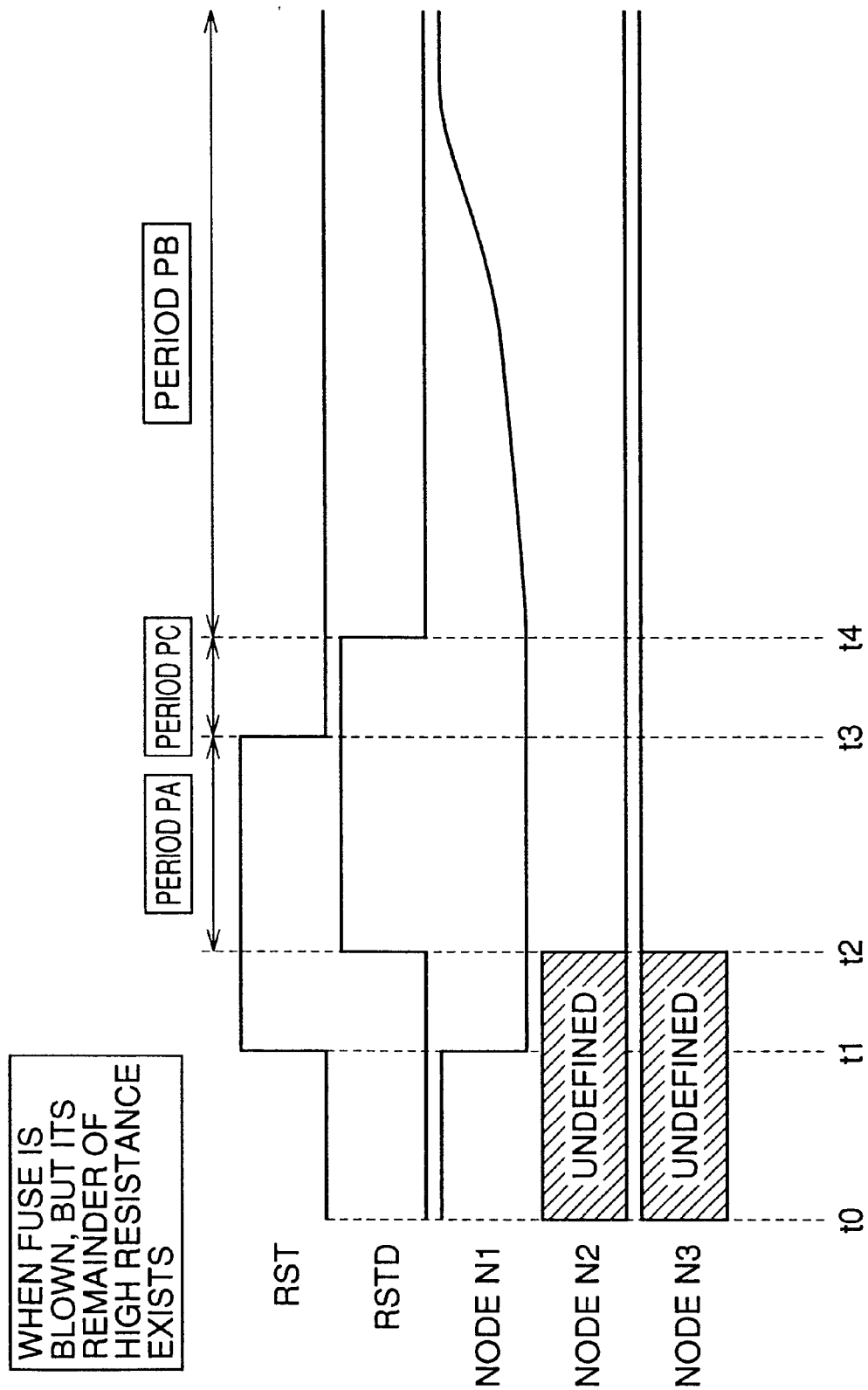
FIG. 9 is a timing chart illustrating the operation of fuse program circuit 100 in the case where there exists a blown fuse remainder.

FIG. 9 is a timing chart illustrating the operation of fuse program circuit 100 shown in FIG. 6 in the case where, although fuse element F100 has been blown, there exists its remainder of high resistance.

During period PA (from t2 to t3), irrespective of the state of fuse F100, transistor QN100 drives nodes Ni and N2 to an L level.

During period PC (from t3 to t4) wherein signal RST is at an L level and signal RSTD is at an H level, even though transistor QP100 turns on, nodes N1 and N2 are maintained at the L level by inverter INV102 within latch circuit LT10, because of the high resistance of the blown fuse remainder.

The ON resistance of a pull-down MOS transistor (not shown) within inverter INV102 is not greater than 100KΩ, which is sufficiently low compared to the resistance value of the blown fuse remainder that is on the order of 10 MΩ. Therefore, nodes N1 and N2 cannot be charged to the level greater than the logical threshold value of inverter INV101. Accordingly, nodes N1 and N2 maintain the L level, and output node N3 maintains the H level.

Further, during period PB (after t4) wherein both signals RST and RSTD attain an L level, transfer gate TG10 is shut down, and latch circuit LT10 retains the state during period PC. Thus, as in period PC, node N2 is at an L level and output node N3 maintains the H level.

During this period PB, as transfer gate TG10 is shut down, node N1 cannot be maintained at the L level. Node N1 is slowly charged via transistor QP100 in the ON state, through the blown fuse remainder. Since transfer gate TG10 is at an OFF state, however, it does not affect the state of latch circuit LT10. Output level N3 thus maintains the H level.

This period PB corresponds to a period in which semiconductor integrated circuit device 1000 is in a normal operation mode. What is needed is only that the stand-by current of semiconductor integrated circuit device 1000 using this fuse program circuit 100 meets its standards during this period.

During period PB, even if there exists a blown fuse remainder, there will not occur any problem of stand-by current, as a current-flowing path does not exist.

Figure 10:
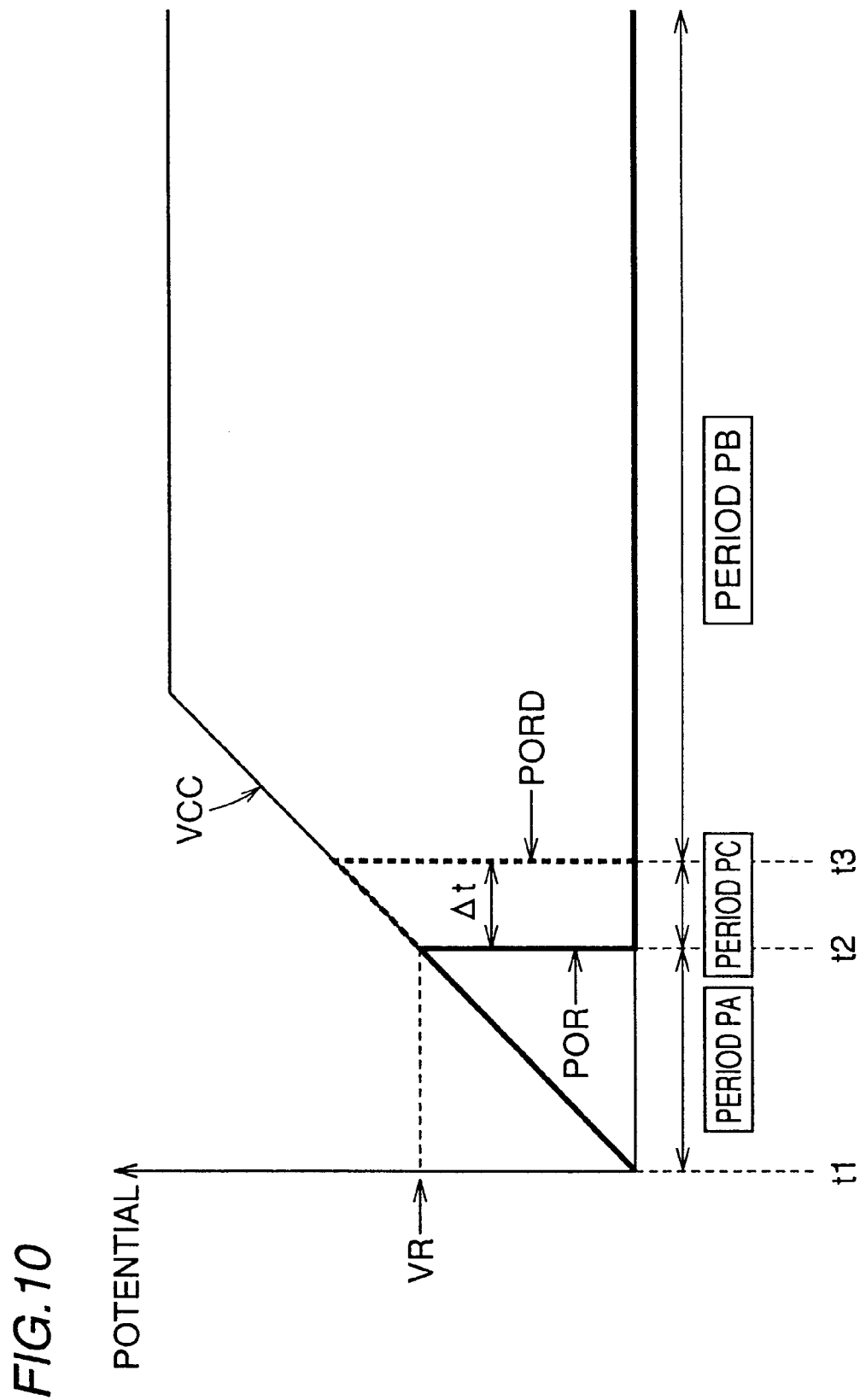
FIG. 10 is a waveform chart illustrating changes of power on reset signal POR and a signal PORD.

Next, assume that reset signal generating circuit 30 generates power on reset signal POR and signal PORD that changes after a prescribed time of delay from signal POR. FIG. 10 is a waveform chart that shows changes of the power on reset signal POR and the signal PORD.

During the power-up operation of power supply potential Vcc, reset signal generating circuit 30 outputs signal POR at the same level as power supply potential Vcc from time t1 to time t2 (during period PA) until power supply potential Vcc reaches a certain value VR.

Once power supply potential Vcc exceeds the potential VR at time t2, signal POR changes to an L level.

Signal PORD changes from the level of power supply potential Vcc to an L level at time t3 that is delayed by an amount of time At from time t2.

Periods PA, PB and PC shown in FIG. 10 correspond to periods PA, PB and PC shown in FIGS. 7–9, respectively. Even upon receipt of such signal POR, fuse program circuit 100 operates in the same manner as explained in conjunction with FIGS. 7–9.

In FIG. 10, signal PORD has been shown to rise above potential VR before changing to the L level. Alternatively, signal PORD may be the signal POR simply delayed by a time Δt.

As explained above, fuse program circuit 100 shown in FIG. 6 not only maintains the characteristic that it has a high operating margin against the blown fuse remainder as in the conventional fuse program circuit 820, but also has a characteristic that it prevents the stand-by current from flowing even in the presence of such a blown fuse remainder.

Modification of First Embodiment

Figure 11:
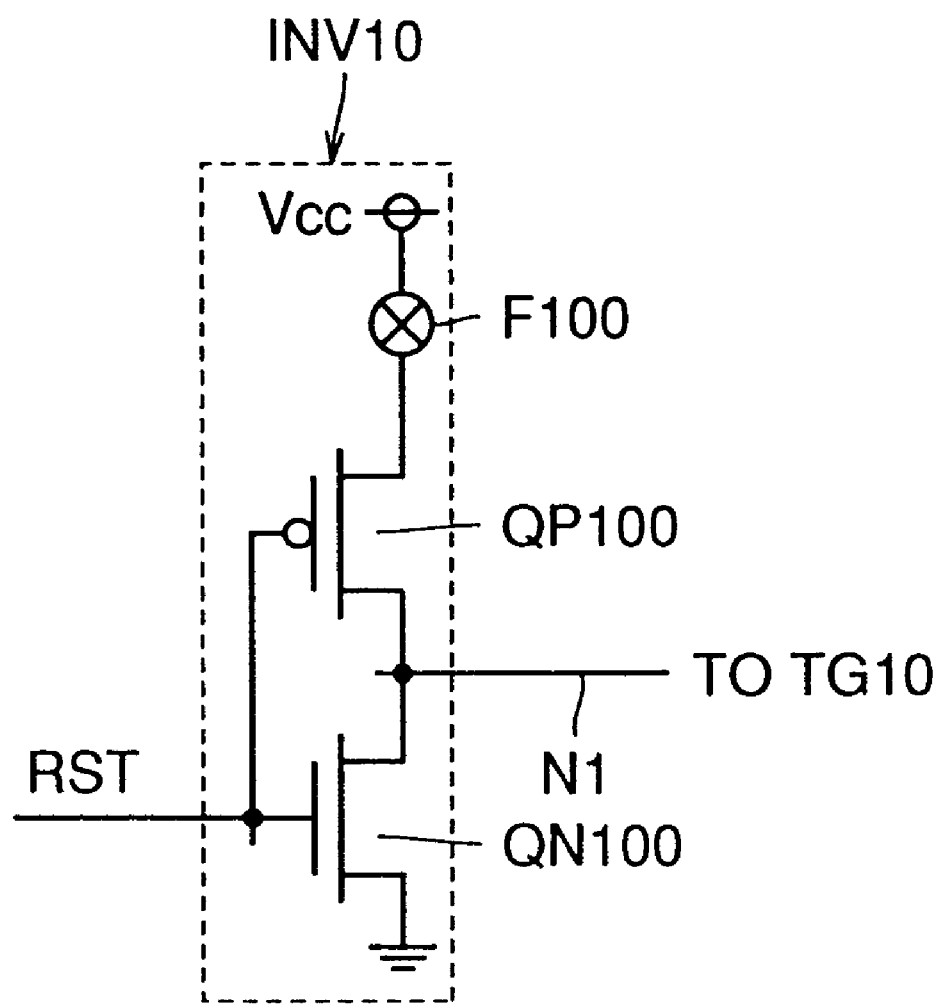
FIG. 11 is a circuit diagram showing another configuration of an inverter INV10 in the configuration of fuse program circuit 100.

FIG. 11 is a circuit diagram illustrating another configuration of inverter INV10 in the configuration of fuse program circuit 100 shown in FIG. 6.

Inverter INV10 includes a fuse element F100, a P channel MOS transistor QP100 and an N channel MOS transistor QN100 that are connected between power supply potential Vcc and ground potential GND.

A connect node between transistor QP100 and transistor QN100 is connected to node N. Fuse element F100 is provided between power supply potential Vcc and a source of transistor QP100.

The gates of transistors QP100 and QN100 both receive signal RST from reset signal generating circuit 30.

Using inverter INV10 having the configuration as shown in FIG. 11, fuse program circuit 100 can operate completely in the same manner as in the case of the configuration shown in FIG. 6.

Second Embodiment

Figure 12:
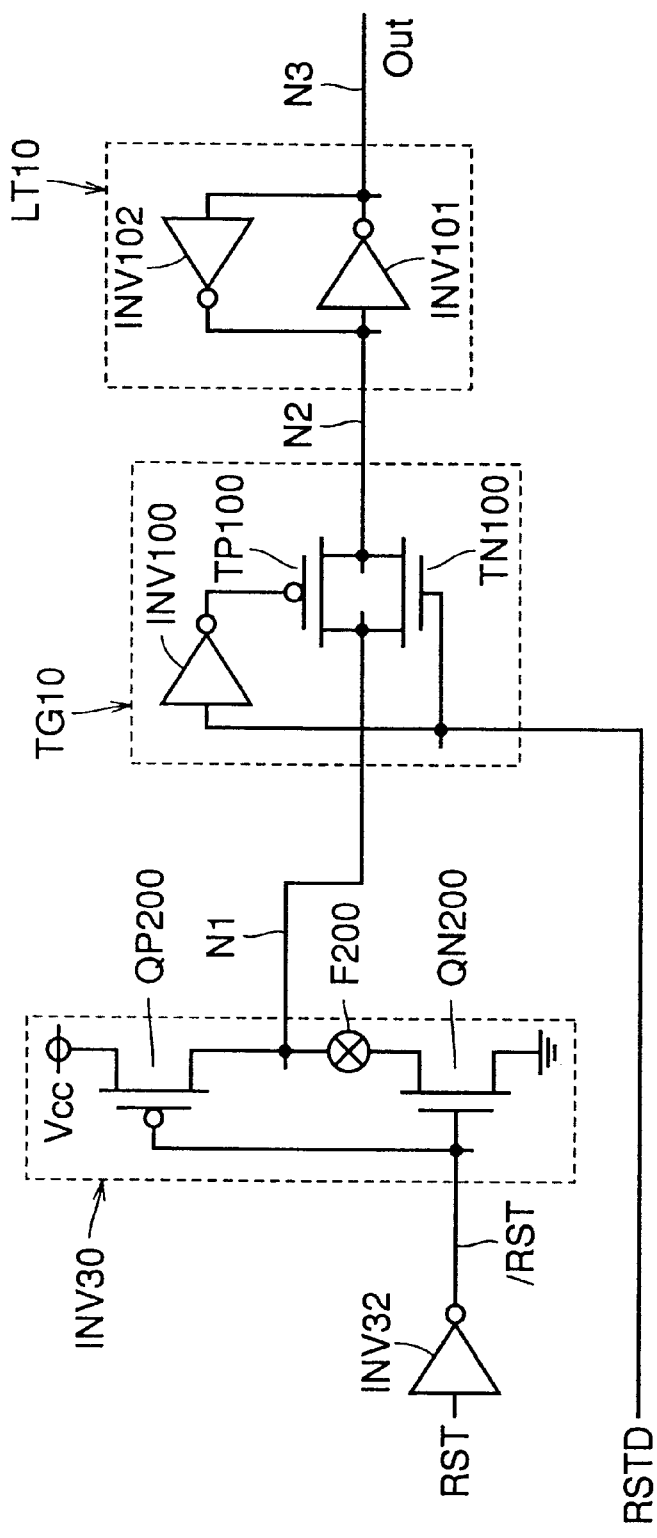
FIG. 12 is a circuit diagram showing a configuration of a fuse program circuit 200 according to a second embodiment of the present invention.

FIG. 12 is a circuit diagram illustrating a configuration of a fuse program circuit 200 according to the second embodiment of the present invention.

The configuration of fuse program circuit 200 is identical to the configuration of fuse program circuit 100 shown in FIG. 6, except that inverter INV10 including fuse element F100 has been replaced with an inverter INV30 including a fuse element F200, and that another inverter INV32 is provided such that inverter INV30 receives a signal (signal /POR or signal /RST) that is an inverted version of the signal in the case of fuse program circuit of FIG. 6.

More specifically, fuse program circuit 200 includes: an inverter INV32 that receives and inverts reset signal RST output from reset signal generating circuit 30 (not shown); an inverter INV30 that receives an output from inverter INV32, and drives the potential level of node N1 according to whether the fuse element is blown or not; a transfer gate TG10 provided between node N1 and node N2 for causing node N1 and node N2 to enter a conductive or shutdown state according to the delayed reset signal RSTD from reset signal generating circuit 30 (not shown); and a latch circuit LT10 provided between node N2 and output node N3 for latching the potential level at node N2 and outputting an inverted level of the potential level of node N2 to node N3.

It is assumed that reset signal generating circuit 30 has a configuration identical to that in the first embodiment.

Inverter INV30 includes a P channel MOS transistor QP200, a fuse element F200 and an N channel MOS transistor QN200 that are connected in series between power supply potential Vcc and ground potential GND.

The gates of transistors QP200 and Qn2OO receive signal /RST from inverter INV32. A connect node between fuse element F200 and transistor QP200 is connected to node N1.

The configurations of transfer gate TG10 and latch circuit LT10 are identical to those described in the first embodiment, and therefore, same reference characters denote same or corresponding portions and detailed description thereof is not repeated.

Fuse program circuit 200 is configured such that it has an output level of an H level when the fuse is not blown and an L level when the fuse is blown.

Figure 13:
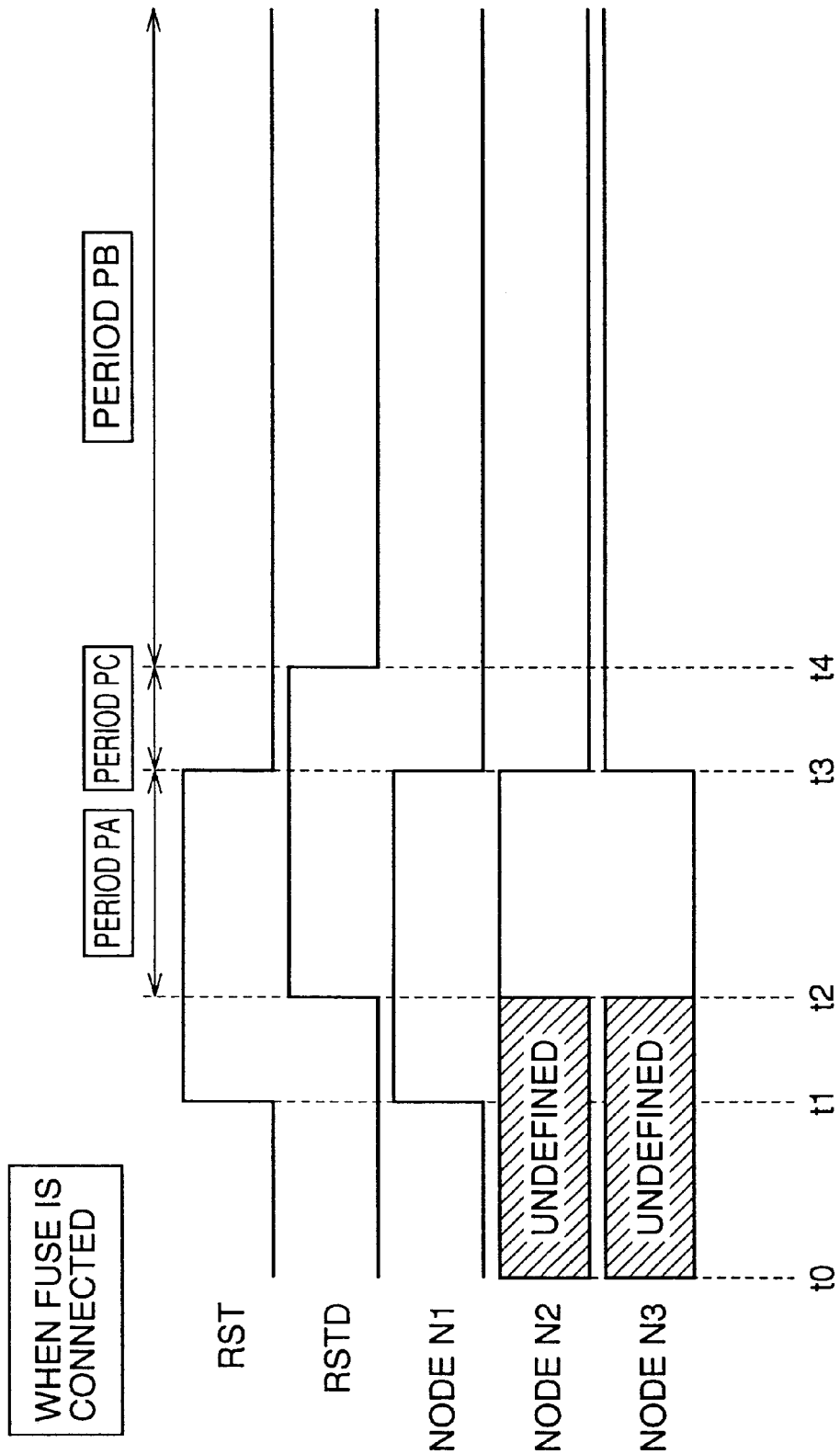
FIG. 13 is a timing chart illustrating an operation of fuse program circuit 200.

FIG. 13 is a timing chart illustrating the operation of fuse program circuit 200 shown in FIG. 12, which corresponds to FIG. 7 of the first embodiment. FIG. 13 shows the operation in the case where fuse element F200 in the configuration of fuse program circuit 200 is not blown.

Figure 14:
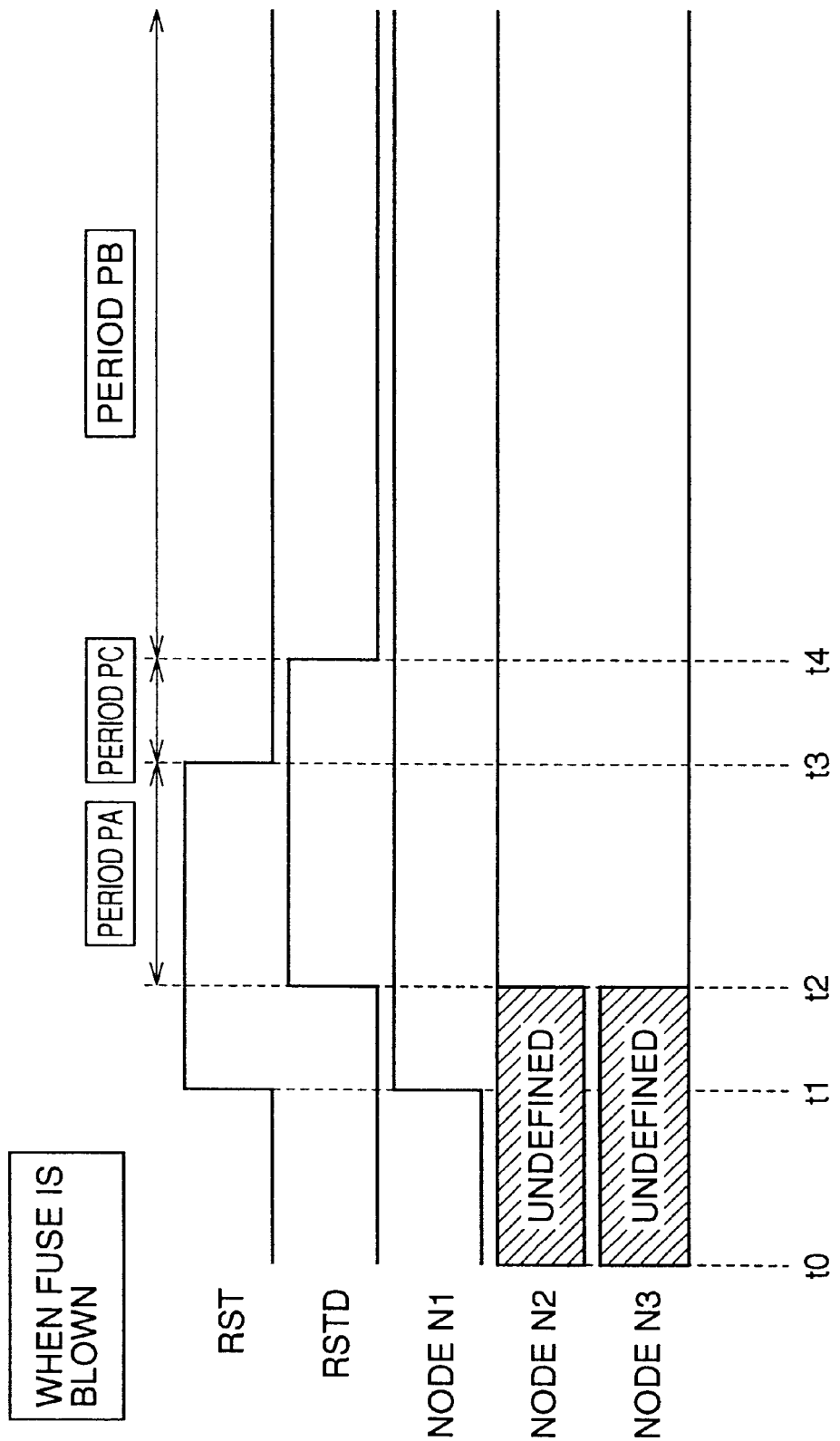
FIG. 14 is a timing chart illustrating the operation of fuse program circuit 200 in the case where a fuse element F200 is blown.

FIG. 14 is a timing chart illustrating the operation of fuse program circuit 200 shown in FIG. 12 in the case where fuse element F200 is blown. This corresponds to FIG. 8 in the first embodiment.

Figure 15:
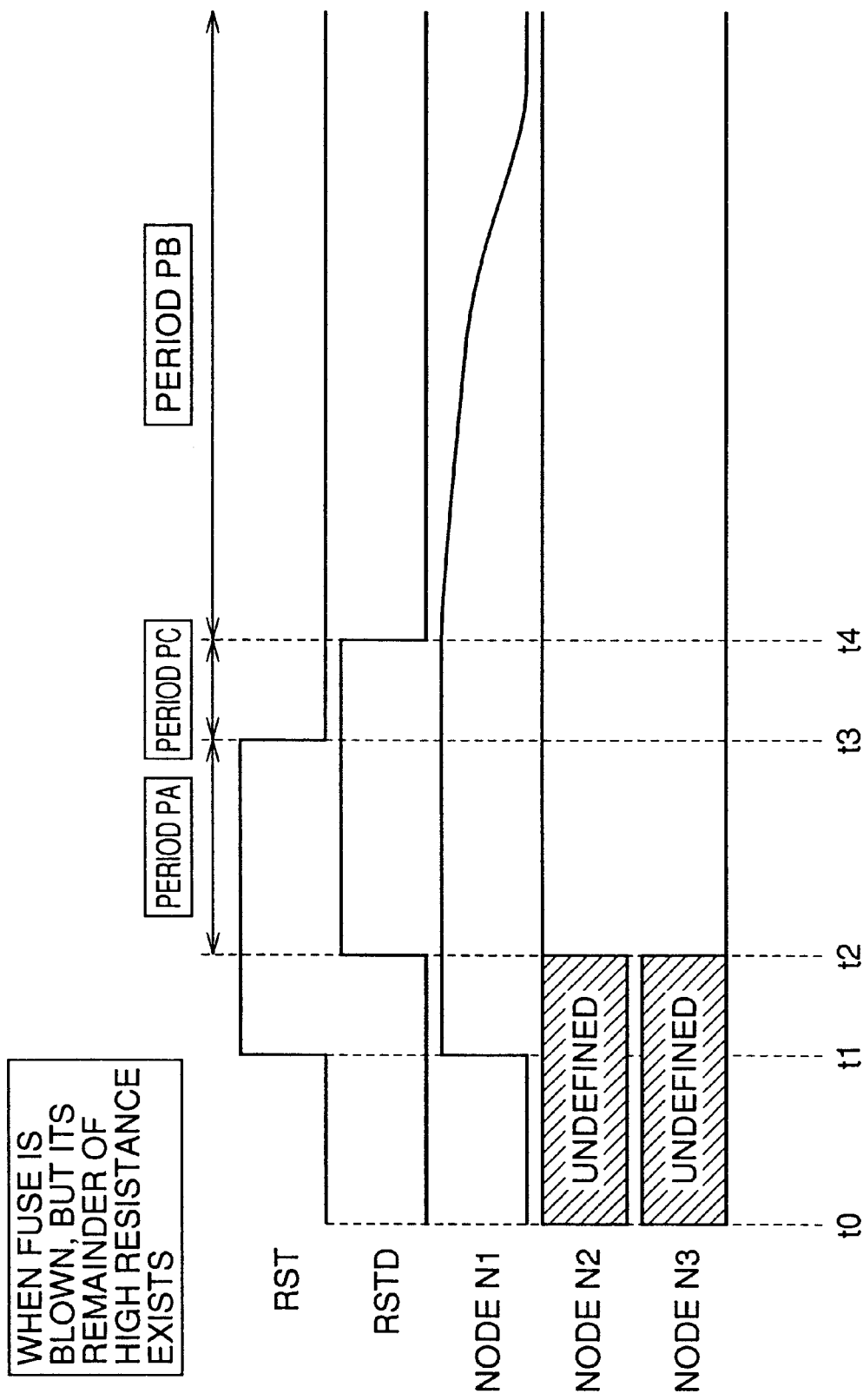
FIG. 15 is a timing chart illustrating the operation of fuse program circuit 200 in the case where there exists a blown fuse remainder.

Further, FIG. 15 is a timing chart illustrating the operation of fuse program circuit 200 shown in FIG. 12 in the case where, although fuse element F200 has been blown, there exists its remainder of high resistance. This corresponds to FIG. 9 in the first embodiment.

In FIGS. 13–15, the output level of inverter INV30 (potential level of node N1) and the potential level of output node N3 are inverted with respect to those in FIGS. 7–9. Otherwise, the operations are identical to those in the first embodiment, and therefore, detailed description thereof will not be repeated.

In fuse program circuit 200 shown in FIG. 12, as in the first embodiment shown in FIG. 10, reset signal generating circuit 30 may be configured such that it generates power on reset signal POR and signal PORD to allow fuse program circuit 200 to operate. Further, reset signal generating circuit 30 may be configured such that it applies to fuse program circuit 200, as reset signal RST, a signal equivalent to a logical OR of the power on reset signal and a signal obtained by buffering the externally supplied reset signal RST, and also applies to fuse program circuit 200, as delayed reset signal RSTD, a signal obtained by delaying the reset signal RST equivalent to the logical OR by a prescribed time.

Fuse program circuit 200 shown in FIG. 12 again maintains the same characteristic as the conventional fuse program circuit 820 that it has a high operating margin against the blown fuse remainder and further has the characteristic that it prevents the stand-by current from flowing even in the presence of the blown fuse remainder.

Modification of Second Embodiment

Figure 16:
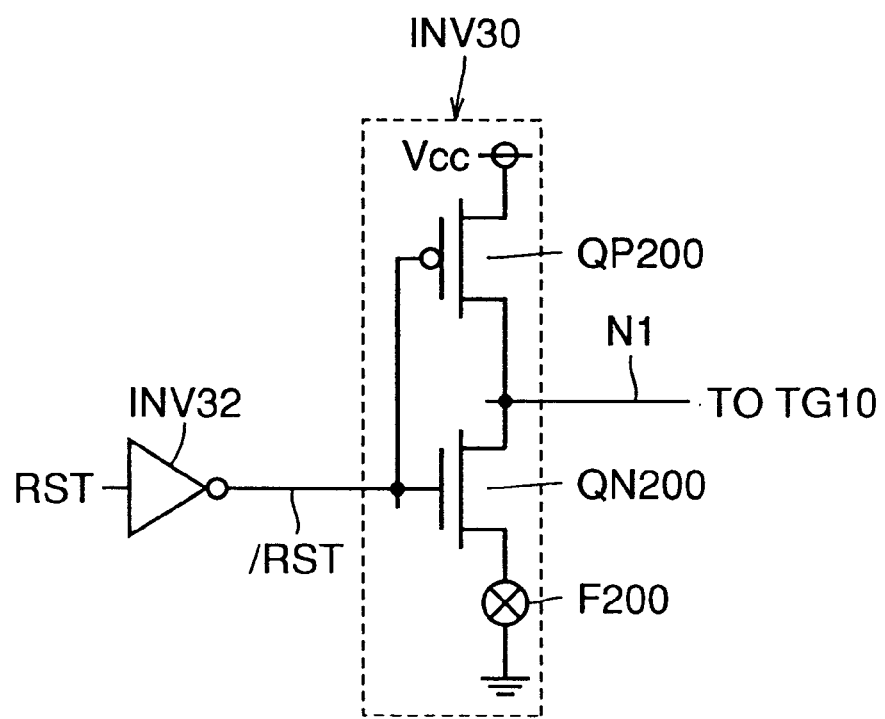
FIG. 16 is a circuit diagram showing another configuration of an inverter INV30 in the configuration of fuse program circuit 200.
Figure 17:
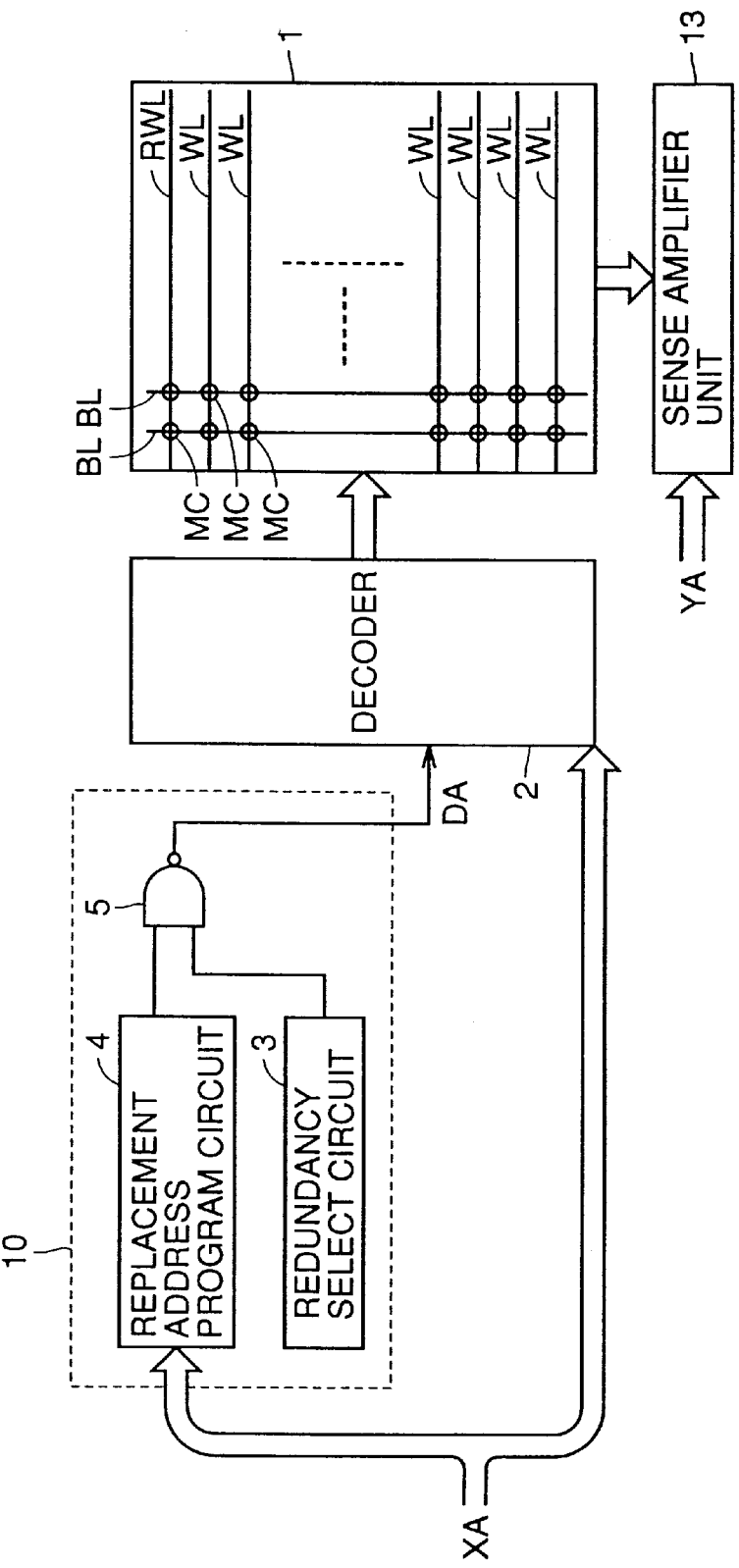
FIG. 17 is a block diagram showing a configuration of a main portion of a conventional semiconductor memory device including a redundant circuit.

FIG. 16 is a circuit diagram illustrating another configuration of inverter INV30 in the configuration of fuse program circuit 200 shown in FIG. 12.

Inverter INV30 includes a P channel MOS transistor QP200, an N channel MOS transistor QN200 and a fuse element F200 that are connected between power supply potential Vcc and ground potential GND.

A connect node between transistor QP200 and transistor QN200 is connected to node Ni. Fuse element F200 is provided between ground potential GND and a source of transistor QN200.

The gates of transistors QP200 and QN200 both receive the output signal /RST from inverter INV32 that inverts signal RST from reset signal generating circuit 30.

Using inverter INV30 having the configuration as shown in FIG. 16, fuse program circuit 200 can operate completely in the same manner as in the case with the configuration shown in FIG. 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A program circuit, comprising:

a signal generating circuit generating a first trigger signal and a second trigger signal that is delayed by a prescribed time from said first trigger signal;

a first internal node;

a drive circuit operating by receiving a first power supply potential and a second power supply potential that is different from said first power supply potential for driving a potential of said first internal node, said drive circuit including
 a first switch circuit provided in a first path extending from said second power supply potential to said first internal node and attaining one of a conductive state and a shutdown state according to said first trigger signal,
 a conduction setting element provided in said first path in series with said first switch circuit and configured to be externally set to one of a conductive state and a non-conductive state in a non-volatile manner, and
 a second switch circuit provided in a second path extending from said first power supply potential to said first internal node and attaining one of a conductive state and a shutdown state, complementarily to said first switch circuit, according to said first trigger signal;

a second internal node;

a third switch circuit responsive to said second trigger signal for driving said first internal node and said second internal node to one of a conductive state and a shutdown state; and a potential retaining circuit operating by receiving said first and second power supply potentials for retaining a potential level of said second internal node for output.

2. The program circuit according to claim 1, wherein said conduction setting element includes a fuse element provided such that it can be externally blown.

3. The program circuit according to claim 1, wherein said potential retaining circuit includes
 a first CMOS inverter having said second internal node and an input node coupled thereto, and
 a second CMOS inverter operating by receiving said first and second power supply potentials for inverting an output of said first CMOS inverter to apply the inverted output to said second internal node.

4. The program circuit according to claim 1, wherein said signal generating circuit generates said first and second trigger signals according to a control signal supplied from an outside of said program circuit.

5. The program circuit according to claim 1, wherein said signal generating circuit generates said first and second trigger signals in response to a rise of one of said first and second power supply potentials.

6. The program circuit according to claim 1, wherein said signal generating circuit generates said first and second trigger signals based on a logical OR of a first signal that is generated according to a control signal supplied from an outside of said program circuit and a second signal that is generated in response to a rise of one of said first and second power supply potentials.

7. A semiconductor memory device, comprising:

a memory cell array having a plurality of memory cells arranged therein, said memory cell array including
- a plurality of normal memory cells and
- a plurality of spare memory cells for recovery of said normal memory cells;

a normal memory cell select circuit for selecting said normal memory cell in response to an address signal; and a redundant memory cell select circuit for prestoring a defective address having a defective memory cell, and selecting said spare memory cell instead of said normal memory cell in response to said address signal, said redundant memory cell select circuit including a program circuit for storing said defective address in a non-volatile manner, said program circuit including
- a signal generating circuit generating a first trigger signal and a second trigger signal that is delayed by a prescribed time from said first trigger signal,
- a first internal node,
- a drive circuit operating by receiving a first power supply potential and a second power supply potential that is different from said first power supply potential for driving a potential of said first internal node, said drive circuit including
- a first switch circuit provided in a first path extending from said second power supply potential to said first internal node and attaining one of a conductive state and a shutdown state according to said first trigger signal,
- a conduction setting element provided in said first path in series with said first switch circuit and configured to be externally set to one of a conductive state and a non-conductive state in a non-volatile manner, and
- a second switch circuit provided in a second path extending from said first power supply potential to said first internal node and attaining one of a conductive state and a shutdown state, complementarily to said first switch circuit, according to said first trigger signal, said program circuit further including
- a second internal node,
- a third switch circuit responsive to said second trigger signal for driving said first internal node and said second internal node to one of a conductive state and a shutdown state, and
- a potential retaining circuit operating by receiving said first and second power supply potential for retaining a potential level of said second internal node and outputting a signal for specification of said defective address.

8. The semiconductor memory device according to claim 7, wherein said conduction setting element includes a fuse element provided such that it can be externally blown.

9. The semiconductor memory device according to claim 7, wherein said potential retaining circuit includes
- a first CMOS inverter having said second internal node and an input node coupled thereto, and
- a second CMOS inverter operating by receiving said first and second power supply potentials for inverting an output of said first CMOS inverter to apply the inverted output to said second internal node.

10. The semiconductor memory device according to claim 7, wherein said signal generating circuit generates said first and second trigger signals according to a control signal that is supplied from an outside of said program circuit.

11. The semiconductor memory device according to claim 7, wherein said signal generating circuit generates said first and second trigger signals in response to a rise of one of said first and second power supply potentials.

12. The semiconductor memory device according to claim 7, wherein said signal generating circuit generates said first and second trigger signals based on a logical OR of a first signal that is generated according to a control signal that is supplied from an outside of said program circuit and a second signal that is generated in response to a rise of one of said first and second power supply potentials.

* * * * *

UNITED STATES PATENT AND TRADEMARK OFFICE
CERTIFICATE OF CORRECTION

PATENT NO.   : 6,320,802 B1  
DATED        : November 20, 2001  
INVENTOR(S)  : Shigeki Ohbayashi Page 1 of 1

It is certified that error appears in the above-identified patent and that said Letters Patent is hereby corrected as shown below:

<u>Title page,</u>
Under Item "[30] Foreign Application Priority Data:", change " 12 " to
-- 2000 --

Signed and Sealed this

Twenty-eighth Day of May, 2002

Attest:

Attesting Officer

JAMES E. ROGAN  
*Director of the United States Patent and Trademark Office*